(12) United States Patent
Dietel

(10) Patent No.: US 12,650,323 B2
(45) Date of Patent: *Jun. 9, 2026

(54) PROGRAMMABLE CARTRIDGE STYLE HYDRAULIC FLOW SENSOR

(71) Applicant: Dale G. Dietel, Waconia, MN (US)

(72) Inventor: Dale G. Dietel, Waconia, MN (US)

( * ) Notice: Subject to any disclaimer, the term of this patent is extended or adjusted under 35 U.S.C. 154(b) by 276 days.

This patent is subject to a terminal disclaimer.

(21) Appl. No.: 18/629,234

(22) Filed: Apr. 8, 2024

(65) Prior Publication Data

US 2024/0328839 A1 Oct. 3, 2024

Related U.S. Application Data

(63) Continuation-in-part of application No. 18/368,687, filed on Sep. 15, 2023, now Pat. No. 12,535,344, which is a continuation-in-part of application No. 18/122,230, filed on Mar. 16, 2023, now Pat. No. 11,892,331, which is a continuation of application No. 17/146,918, filed on Jan. 12, 2021, now Pat. No. 11,614,351.

(60) Provisional application No. 63/408,178, filed on Sep. 20, 2022, provisional application No. 63/006,157, filed on Apr. 7, 2020.

(51) Int. Cl.
| | |
|---|---|
| *G01F 1/11* | (2006.01) |
| *G01F 1/115* | (2006.01) |
| *G01F 1/60* | (2006.01) |
| *G01F 15/00* | (2006.01) |
| *G01F 15/02* | (2006.01) |
| *G01F 15/06* | (2022.01) |
| *G01L 19/00* | (2006.01) |
| *G01R 33/07* | (2006.01) |

(52) U.S. Cl.
CPC .............. *G01F 1/1155* (2013.01); *G01F 1/60* (2013.01); *G01F 15/005* (2013.01); *G01F 15/022* (2013.01); *G01F 15/068* (2013.01); *G01L 19/0092* (2013.01); *G01R 33/072* (2013.01)

(58) Field of Classification Search
None
See application file for complete search history.

(56) References Cited

U.S. PATENT DOCUMENTS

| | | | | | |
|---|---|---|---|---|---|
| 3,701,277 | A | * | 10/1972 | McMahon ............ | G01F 15/066 73/861.87 |
| 4,566,317 | A | * | 1/1986 | Shakra ..................... | G01F 1/10 73/152.35 |

(Continued)

*Primary Examiner* — Eric S. McCall
*Assistant Examiner* — Nigel H Plumb
(74) *Attorney, Agent, or Firm* — Edwin E. Voigt, II

(57) ABSTRACT

A cartridge-style flow sensor for sensing fluid flow within a manifold. The sensor includes an exterior, interior, a circuit board, and first and second ports. The first and second ports permit fluid to flow into and out of the interior. A encoder/sensor in the interior detects the number of revolutions of an impeller. An electric coupler interfaces with the sensor and a transmitter for communication of the revolutions of the impeller to a controller. The controller determines the rate of fluid flow in a conduit. The controller automatically issues a command signal to a component of a hydraulic system to alter the rate of fluid flow in the conduit. The cartridge hydraulic flow sensor is easily and releasably engaged to a cavity of a hydraulic circuit manifold.

17 Claims, 14 Drawing Sheets

(56)                References Cited

U.S. PATENT DOCUMENTS

|  |  |  |  |  |
|---|---|---|---|---|
| 7,624,632 | B1 * | 12/2009 | Hoyle | G01F 1/6847 |
|  |  |  |  | 73/204.11 |
| 12,535,344 | B2 * | 1/2026 | Dietel | G01F 1/1155 |
| 2003/0074984 | A1 * | 4/2003 | Peterson | G01F 1/075 |
|  |  |  |  | 73/861.77 |
| 2012/0325016 | A1 * | 12/2012 | Peled | G01F 1/115 |
|  |  |  |  | 73/273 |
| 2022/0397089 | A1 | 12/2022 | Zahe |  |
| 2022/0397211 | A1 | 12/2022 | Zahe |  |
| 2022/0397439 | A1 * | 12/2022 | Zähe | F16K 51/00 |

* cited by examiner

CHART "A"

| Flow Setting GPM | Output .5-5v | Output 1-IOv |
|---|---|---|
| 10 | 0 | 8 |
| 15 | 1 | 9 |
| 20 | 2 | A |
| 25 | 3 | B |
| 50 | 4 | C |
| 75 | 5 | D |
| 100 | 6 | E |
| 125 | 7 | F |

GRAPH "A"

Flow/Output Selections
{see chart)

PROGRAMMABLE CARTRIDGE STYLE HYDRAULIC FLOW SENSOR

CROSS-REFERENCE TO RELATED APPLICATIONS

This application is a Continuation-in-Part and claims the benefit of U.S. patent application Ser. No. 18/368,687 filed Sep. 15, 2023 which is incorporated herein by reference in its entirety. U.S. patent application Ser. No. 18/368,687 filed Sep. 15, 2023 is a Continuation-in-Part and claims the benefit of U.S. patent application Ser. No. 18/122,230 filed Mar. 16, 2023. U.S. patent application Ser. No. 18/122,230 issued as U.S. Pat. No. 11,892,331 on Feb. 6, 2024. U.S. patent application Ser. No. 18/122,230 filed Mar. 16, 2023 is a continuation of U.S. patent application Ser. No. 17/146,918 filed Jan. 12, 2021, issued as U.S. Pat. No. 11,614,351 on Mar. 28, 2023. U.S. patent application Ser. No. 17/146,918 filed Jan. 12, 2021, claims the benefit of U.S. Provisional Patent Application Ser. No. 63/006,157 filed Apr. 7, 2020, all of which being incorporated by reference in their entireties.

This application also claims the benefit of U.S. Provisional Patent Application Ser. No. 63/408,178 filed Sep. 20, 2022 which is incorporated by reference in its entirety.

BACKGROUND OF THE INVENTION

The invention is directed to a cartridge style hydraulic flow sensor for engagement into, and for removal from, a hydraulic circuit manifold. The cartridge style hydraulic flow sensor may be electrically engaged to, and in communication with, a controller and/or processor to monitor fluid flow through a hydraulic circuit manifold. The cartridge style hydraulic flow sensor assists the controller in the automatic adjustment of a setting of a pumping or hydraulic system to provide for a desired volume of liquid flowing through the hydraulic circuit manifold.

In the past hydraulic flow sensors have been difficult to incorporate into a hydraulic system. In the past a hydraulic line has been required to be cut and a hydraulic flow sensor sealed within the artificially created gap within the hydraulic line. The insertion of a hydraulic flow sensor within a hydraulic line naturally required labor intensive activities, as well as skill to plumb the hydraulic flow sensor into the hydraulic line, while maintaining the integrity of the hydraulic line and preventing leakage of fluid.

Simultaneously with the modification to an existing hydraulic line, wires were required to be added proximate to the hydraulic line so that communication would be established between the inserted hydraulic sensor and a display unit and control unit. The display unit frequently included components to translate the fluid flow rate into an analog or digital signal. However, adjustment to the flow within a hydraulic system required an individual to manipulate a hydraulic system control unit on a different control panel in order to effectuate a change in the rate of fluid flow within the hydraulic system.

Another problem with the known prior art was the difficulties to maintain and/or replace a conventional hydraulic flow sensor which had been previously plumbed into a hydraulic line. In the past to maintain or replace a hydraulic flow sensor an individual was required to cut an existing hydraulic flow sensor out of an existing hydraulic line in order to access, reconfigure, repair and/or replace the non-performing or defective hydraulic flow sensor.

In addition to the drawbacks identified above, no known hydraulic flow sensor exists which is easily engaged or disengaged from a hydraulic circuit manifold and which simultaneously provides communication with a controller/processor which may sense fluid flow and performance within a hydraulic line or hydraulic system and which may automatically adjust the hydraulic system to provide a desired level of performance.

The art referred to and/or described above is not intended to constitute an admission that any patent, publication or other information referred to herein is "prior art" with respect to this invention. In addition, this section should not be construed to mean that a search has been made or that no other pertinent information as defined in 37 C.F.R. § 1.56 (a) exists.

All U.S. patents and applications and all other published documents mentioned anywhere in this application are incorporated herein by reference in their entireties.

Without limiting the scope of the invention, a brief description of some of the claimed embodiments of the invention is set forth below. Additional details of the summarized embodiments of the invention and/or additional embodiments of the invention may be found in the Detailed Description of the Invention below.

A brief abstract of the technical disclosure in the specification is provided for the purposes of complying with 37 C.F.R. § 1.72.

SUMMARY OF THE INVENTION

In at least one embodiment, the cartridge style hydraulic flow sensor is conveniently inserted within and/or removed from a hydraulic circuit manifold. The cartridge style hydraulic flow sensor is simultaneously easily coupled to a controller/processor used to monitor the operational performance of a hydraulic fluid circuit. A pump or other component may be automatically adjusted after the operational performance of the hydraulic system is determined based on information received from the cartridge style hydraulic flow sensor.

In some embodiments, the cartridge style hydraulic flow sensor includes an impeller engaged to a shaft. A sensing element may be proximate to the impeller in order to detect the revolutions of the impeller over a period of time. The sensing element may include magnets. A Hall Effect Sensor may be in communication with a programmable logic controller for a hydraulic system or machine. The programmable logic controller may analyze the sensed rotations of the impeller and automatically adjust the flow rate of fluid passing through a fluid conduit and hydraulic circuit manifold.

In at least one embodiment, the cartridge style hydraulic flow sensor is bidirectional, and may sense fluid passage from opposite directions when engaged to a hydraulic circuit manifold.

In some embodiments, the cartridge style hydraulic flow sensor may be engaged to a hydraulic circuit manifold from a vertical or horizontal direction, or from any desired angle.

In some embodiments, the impeller may be engaged to a shaft which in turn is engaged to a gear. A Hall Effect Sensor may be used to sense, record and communicate the revolutions of the gear in order to determine the status and/or performance of a hydraulic system.

In at least one embodiment, the programmable logic controller may be in communication with a remotely located processor/controller which may interface with an operator of a hydraulic system or machine. The remotely located processor/controller may be in communication with pumps, fluid sources, valves or other components of a hydraulic system or machine to manually or automatically adjust the operational parameters of the hydraulic system or machine.

In at least one embodiment, the cartridge style hydraulic flow sensor includes an interior, at least one inlet port, and at least one outlet port. The impeller may be positioned proximate to and between the inlet port and the outlet port.

In at least one embodiment, the cartridge style hydraulic flow sensor includes a rotational detector and a rotational transmitter being in communication with either a programmable logic controller or a remotely located processor/controller.

In at least one embodiment, the rotational transmitter will be in communication with either a programmable logic controller and/or a remotely located processor/controller through a hardwire connection or through the use of Bluetooth or Wi-Fi.

In some embodiments, the cartridge style hydraulic flow sensor may be inserted into and engaged within a hydraulic circuit manifold, or may be placed within a hydraulic fluid line.

In at least one embodiment, the cartridge style hydraulic fluid sensor may include a check valve limiting fluid flow to a single direction.

In another alternative embodiment, a cartridge hydraulic flow sensor includes a cylindrical casing comprising an exterior, an interior, an outlet section, and a base, the casing having a first port and a second port through the casing, the first port and the second port permitting a fluid to flow into the interior and out of the interior, the first port being proximate to the base and the second port being in the outlet section, a Hall Effect Sensor is disposed in the interior, the Hall Effect Sensor being proximate to the second port, the Hall Effect Sensor detecting a number of revolutions of a rotatable impeller rotating about a shaft during a period of time, the rotatable impeller being engaged to a shaft support having the shaft, the impeller revolving about the shaft following contact with the flow of the fluid, and a cover having a communication connector, the communication connector being in communication with a circuit board, the circuit board being in communication with the Hall Effect Sensor, wherein the Hall Effect Sensor communicates to the circuit board the detected number of revolutions of the impeller about the shaft during the period of time, the circuit board being constructed and arranged to compare the detected number of revolutions of the impeller about the shaft during the period of time to data stored on the circuit board, the circuit board communicating to the communication connector at least one of the detected number of revolutions of the impeller about the shaft during the period of time, the detected number of revolutions of the impeller about the shaft during the period of time exceeding the data, and the detected number of revolutions of the impeller about the shaft during the period of time being less than the data, and further wherein the cylindrical casing is constructed and arranged for insertion into a cavity of a manifold, the cavity being in fluid flow communication with a manifold conduit, the head being proximate to a manifold exterior and the base being disposed in a manifold interior, the first port and the second port being in fluid flow communication with the manifold conduit.

In some embodiments the circuit board further includes a receiving connector, a plurality of connection wires, and an interface connector connected to the connection wires.

In at least one embodiment, the circuit board further includes a selector switch, a microprocessor and memory.

In at least one alternative embodiment, data is stored on the memory and the microprocessor compares the detected number of revolutions of the impeller about the shaft during the period of time to the data.

In another alternative embodiment, the data comprises a plurality of individual fluid flow information parameters, and further wherein the selector switch directs the microprocessor to at least one of the plurality of individual fluid flow information parameters.

In some embodiments, the interior further includes at least one of a sensor shoulder, a circumferential head groove, and a circuit board shoulder.

In at least one embodiment, the exterior further includes at least one of a first seal channel and a second seal channel.

In at least one alternative embodiment, the at least one casing exterior seal is disposed in at least one of the first seal channel and the second seal channel.

In another alternative embodiment, the Hall Effect Sensor additionally includes an exterior, the Hall Effect Sensor exterior having at least one of a third seal channel and a fourth seal channel.

In some embodiments, at least one Hall Effect Sensor exterior seal is disposed in at least one of the third seal channel and the fourth seal channel.

In at least one embodiment, the interior has the circuit board shoulder, the circuit board engaging the circuit board shoulder.

In at least one alternative embodiment, the circuit board has at least one slot passage.

In another alternative embodiment, the shaft support has a base collar, at least two spindle supports, and a central column.

In some embodiments, the interior has the sensor shoulder, the Hall Effect Sensor exterior having a lower sensor ledge, the lower sensor ledge engaging the sensor shoulder.

In at least one embodiment, the Hall Effect Sensor exterior has a head nub, the head nub engaging the circumferential head groove.

In at least one alternative embodiment, the cartridge hydraulic flow sensor includes a pressure sensor, the pressure sensor being disposed in the interior, the pressure sensor detecting fluid pressure within the manifold conduit.

In another alternative embodiment, the cartridge hydraulic flow sensor includes a temperature sensor disposed in the interior, the temperature sensor detecting a temperature of the fluid within the interior.

In some embodiments, the circuit board communicates at least two of the detected number of revolutions of the impeller about the shaft, the detected fluid pressure within the manifold conduit, and the detected temperature of the fluid within the interior.

In at least one embodiment, the circuit board automatically communicates a command signal to at least one component of a hydraulic system for modification of at least one of a rate of fluid passage, the detected fluid pressure within the manifold conduit, and the detected temperature of the fluid within the interior.

These and other embodiments which characterize the invention are pointed out with particularity in the claims annexed hereto and forming a part hereof. However, for further understanding of the invention, its advantages and objectives obtained by its use, reference should be made to the drawings which form a further part hereof and the accompanying descriptive matter, in which there is illustrated and described embodiments of the invention.

Various other objects, features and attendant advantages of the present invention will become fully appreciated as the same becomes better understood when considered in conjunction with the accompanying drawings, in which like reference characters designate the same or similar parts throughout the several views, and wherein:

DETAILED DESCRIPTION OF THE INVENTION

Figures 5, 6:
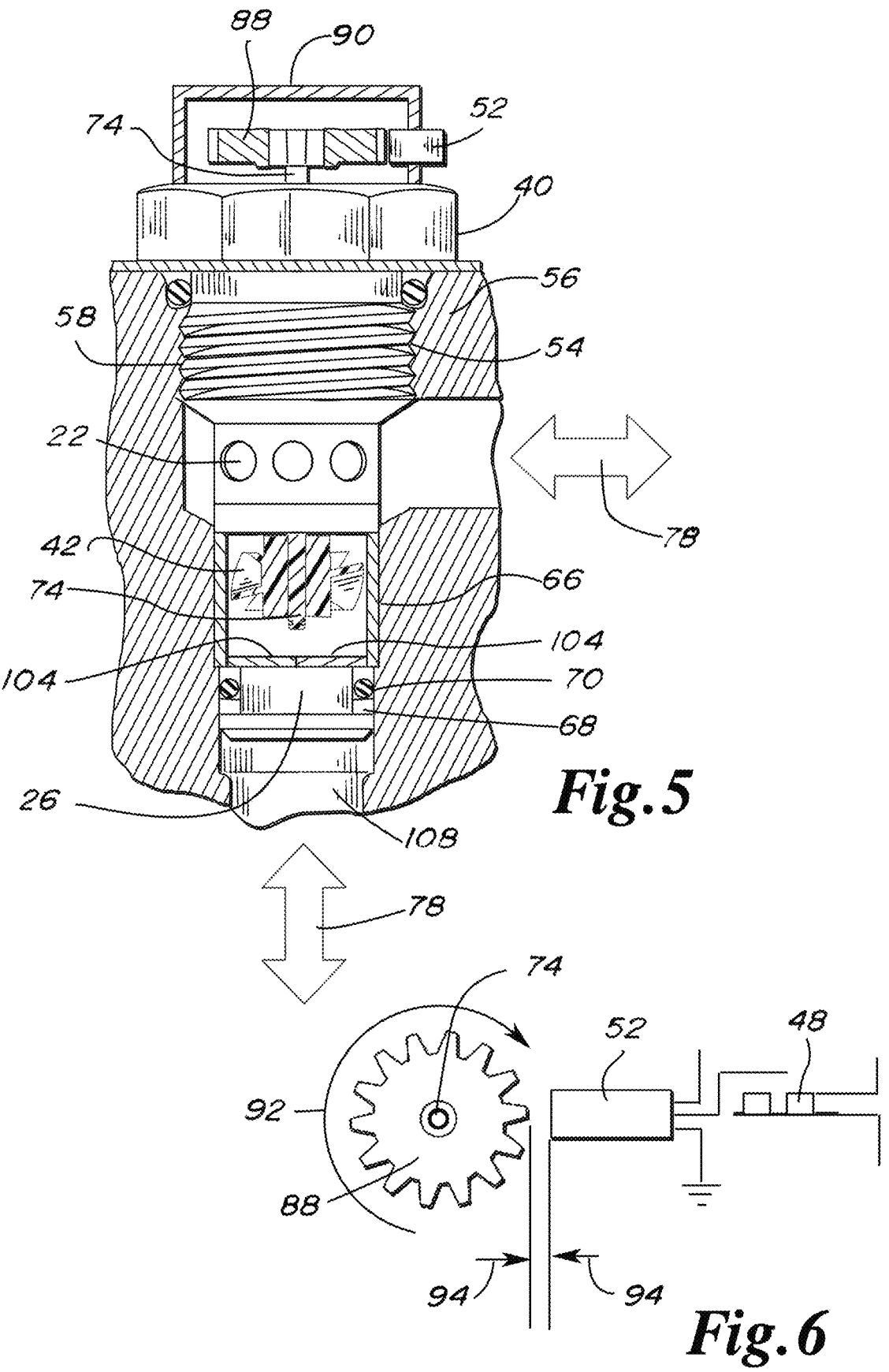
FIG. 5 is an alternative cross-sectional side view of one embodiment of the cartridge style hydraulic flow sensor taken along the line 2-2 of FIG. 1, as engaged to a hydraulic circuit manifold.
FIG. 6 is a detail schematic diagram of one embodiment of a gear in communication with a Hall Effect Sensor of the cartridge style hydraulic flow sensor.
Figure 7:
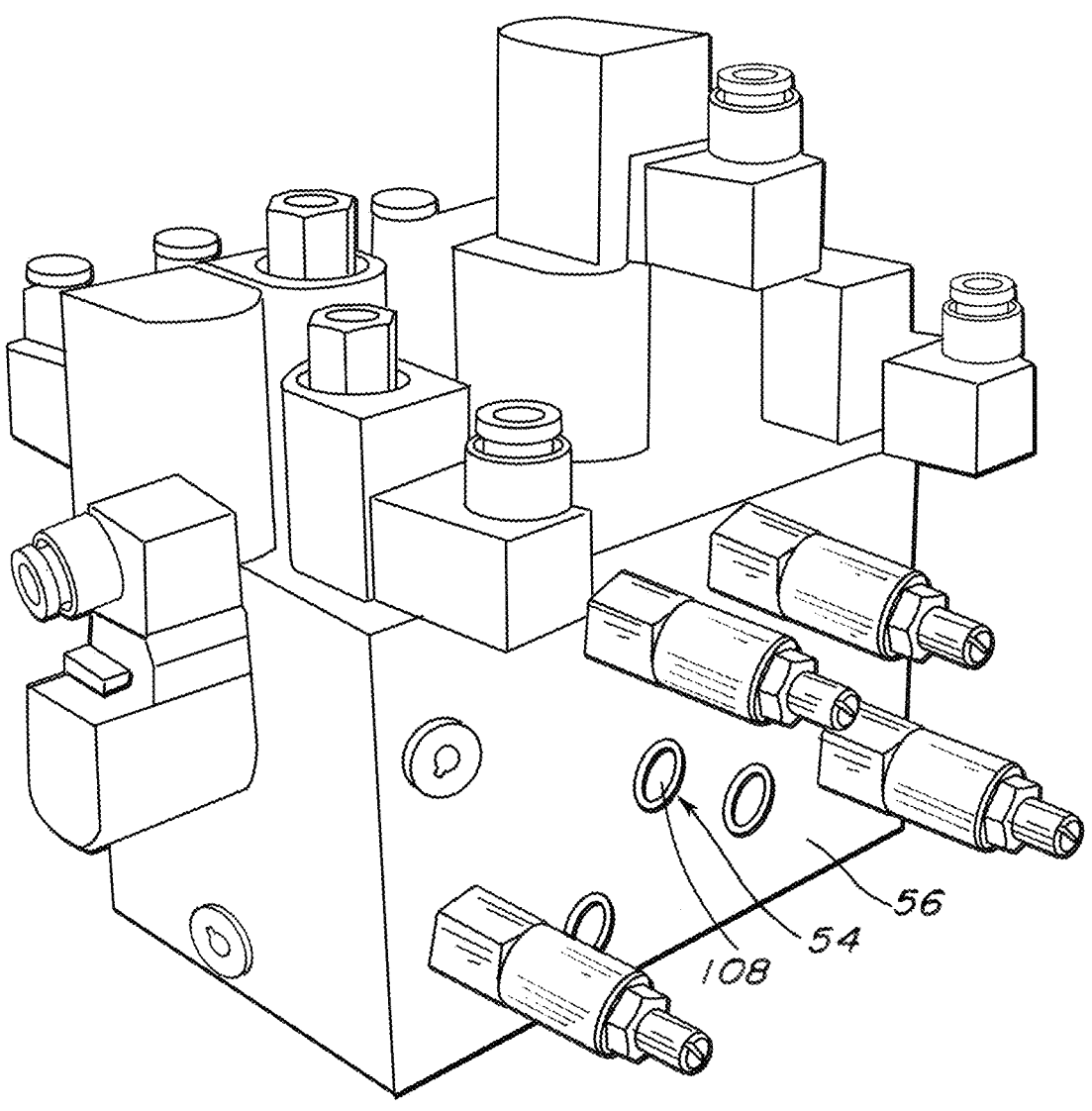
FIG. 7 is a perspective view of one alternative embodiment of the cartridge style hydraulic flow sensor engaged to a hydraulic circuit manifold.

Referring to FIG. 1 through FIG. 4 the cartridge style hydraulic flow sensor is in general referred to by reference numeral 20. The cartridge style hydraulic flow sensor 20 is preferably releasably coupled to a cavity 54 of a hydraulic circuit manifold 56. (FIG. 5 and FIG. 7)

In at least one embodiment, the cavity 54 includes internal threads proximate to the outer surface of the hydraulic circuit manifold 56. The cartridge style hydraulic flow sensor 20 includes mating threads 58 which engage the threads of the cavity 54 to secure the cartridge style hydraulic flow sensor 20 within the hydraulic circuit manifold 56.

In an alternative embodiment, the interior of the cavity 54 is a smooth bore and does not include any internal threads. In this embodiment, the cartridge style hydraulic flow sensor 20 may be inserted within the cavity 54 and may be secured within the cavity 54 through the use of a cap. The cap may be threaded or otherwise affixed to the exterior of the hydraulic circuit manifold 56 covering the top of the cartridge style hydraulic flow sensor 20.

In at least one embodiment, the cartridge style hydraulic flow sensor 20 includes a body 40 which is exterior to the hydraulic circuit manifold 56 following engagement of the cartridge style hydraulic flow sensor 20 within the cavity 54. The body 40 may be used to tighten the engagement between the mating threads 58 and the internal threads of the cavity 54.

In at least one embodiment, a head 60 extends upwardly from the body 40. The head 60 preferably includes a circular ledge 62 descending from the upper surface of the head 60 downwardly towards the body 40. The circular ledge 62 preferably receives a platform 50 which may be releasably secured to the head 60 by the use of a mechanical fastener, one example of which is a screw.

In one embodiment, the platform 50 includes a electronic coupler 64 which preferably includes power/communication leads 72 and a transmitter 38.

In one alternative embodiment, a cylindrical casing 66 extends downwardly from the body 40 and mating threads 58 towards a base 68. The base 68 may include a groove receiving an elastic base O-ring 70. An upper portion of the cylindrical casing 66 preferably includes a plurality of outlet fluid conduits 22. In some embodiments the outlet fluid conduits 22 pass through the cylindrical casing 66 above the impeller 42.

In at least one embodiment, fluid enters the cartridge style hydraulic flow sensor 20 from below or proximate to the base 68 as represented by arrow 78. The fluid moves upwardly within cylindrical casing 66 past impeller 42 and exits the cartridge style hydraulic flow sensor 20 through the plurality of outlet fluid conduits 22 and into a fluid conduit within the hydraulic circuit manifold 56.

In an alternative embodiment, the outlet fluid conduits 22 may be an inlet fluid conduit when liquid enters the cartridge style hydraulic flow sensor 20 in an opposite direction as related to arrow 78. The fluid will then exit the cartridge style hydraulic flow sensor 20 proximate to base 68.

Figures 1, 2:
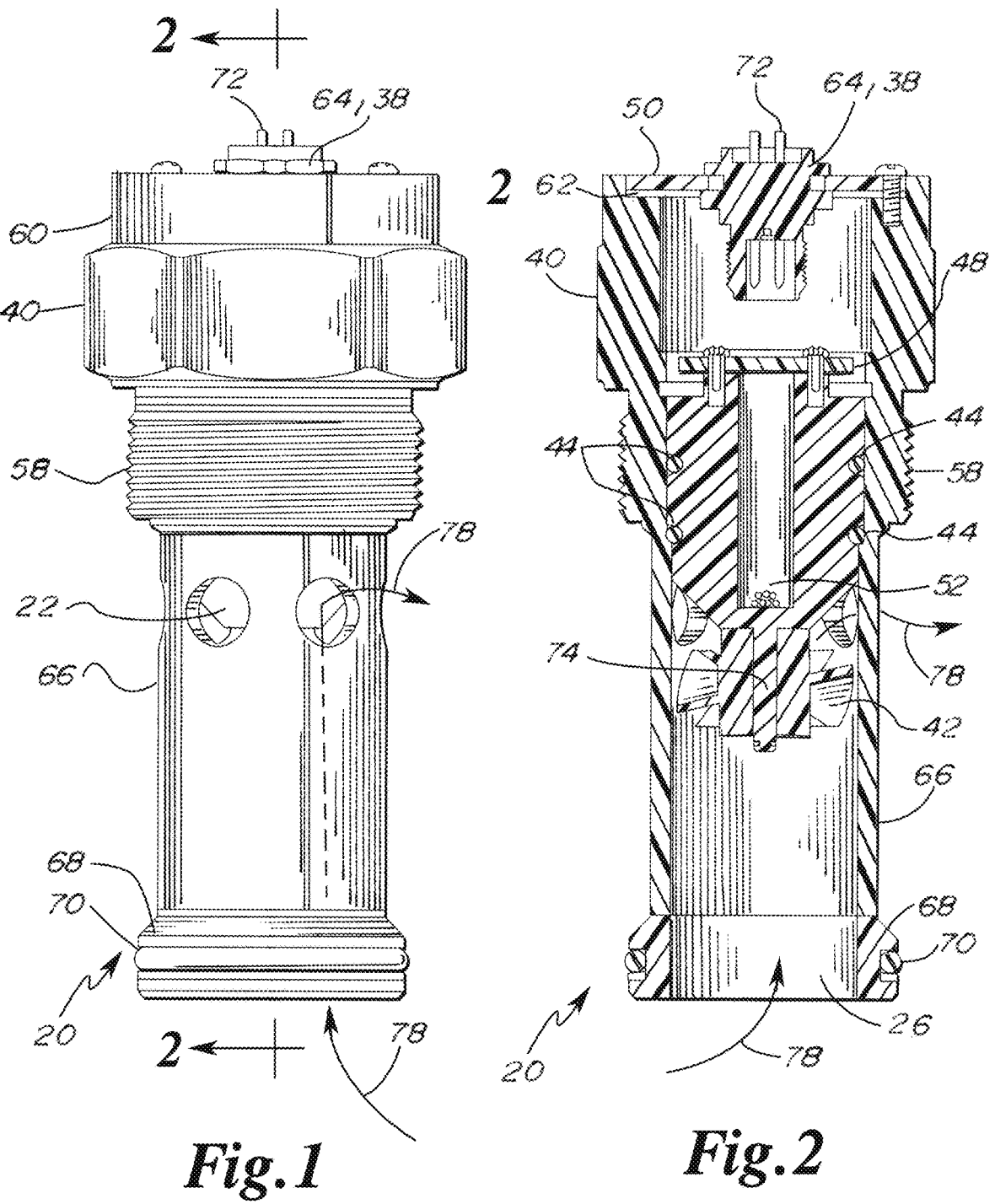
FIG. 1 is a side elevation view of one alternative embodiment of the cartridge style hydraulic flow sensor.
FIG. 2 is a cross-sectional side view of one alternative embodiment of the cartridge style hydraulic flow sensor taken along the line 2-2 of FIG. 1.

With reference to FIG. 2, the electronic coupler 64 extends downwardly from the top of head 60 into the interior of the cartridge style hydraulic flow sensor 20. The leads 72 extend downwardly for engagement to a circuit board 48 which may be a printed circuit board including a programmable logic controller.

In at least one embodiment, the circuit board 48 is positioned above, and is in communication with a Hall Effect Sensor 52. A shaft 74 preferably extends downwardly from the Hall Effect Sensor 52 towards the base 68. An impeller 42 is preferably rotatably engaged to the shaft 74. The impeller 42 preferably includes a plurality of shaped fins or blades which freely rotate relative to the shaft 74 upon exposure to a passing fluid flow. In one embodiment, the impeller 42 may include internal bearings for engagement to the shaft 74, to facilitation free rotation between the impeller 42 and shaft 74.

In at least one embodiment, at least one of the shaped fins or blades of the impeller 42 include or are embedded with a magnetic material. Rotation of the impeller 42 is sensed by the Hall Effect Sensor 52 where the Hall Effect Sensor 52 counts the revolutions of the impeller 42 during a preestablished period of time. The counted revolutions of the impeller 42 are communicated from the Hall Effect Sensor 52 to the circuit board 48. Circuit board 48 will then receive, analyze, and compare the number of revolutions of the impeller 42 to pre-stored data of impeller revolutions, for communication to a remote controller/processor 76 having an interface with an operator. Alternatively, the circuit board 48 may activate the transmitter 38 for re-communication of the sensed impeller revolutions for processing and analysis at the remote controller/processor 76.

In at least one embodiment, one or more O-rings 44 may be placed into grooves in the exterior surface of the Hall Effect Sensor 52. The O-rings 44 assist to establish a fluid seal between the Hall Effect Sensor 52 and the interior surface of the cylindrical casing 66, or the mating threads 58. In one embodiment, the base O-ring 70 is used to establish a fluid seal between the base 68 and the interior surface of a cavity 54.

Figures 3, 4:
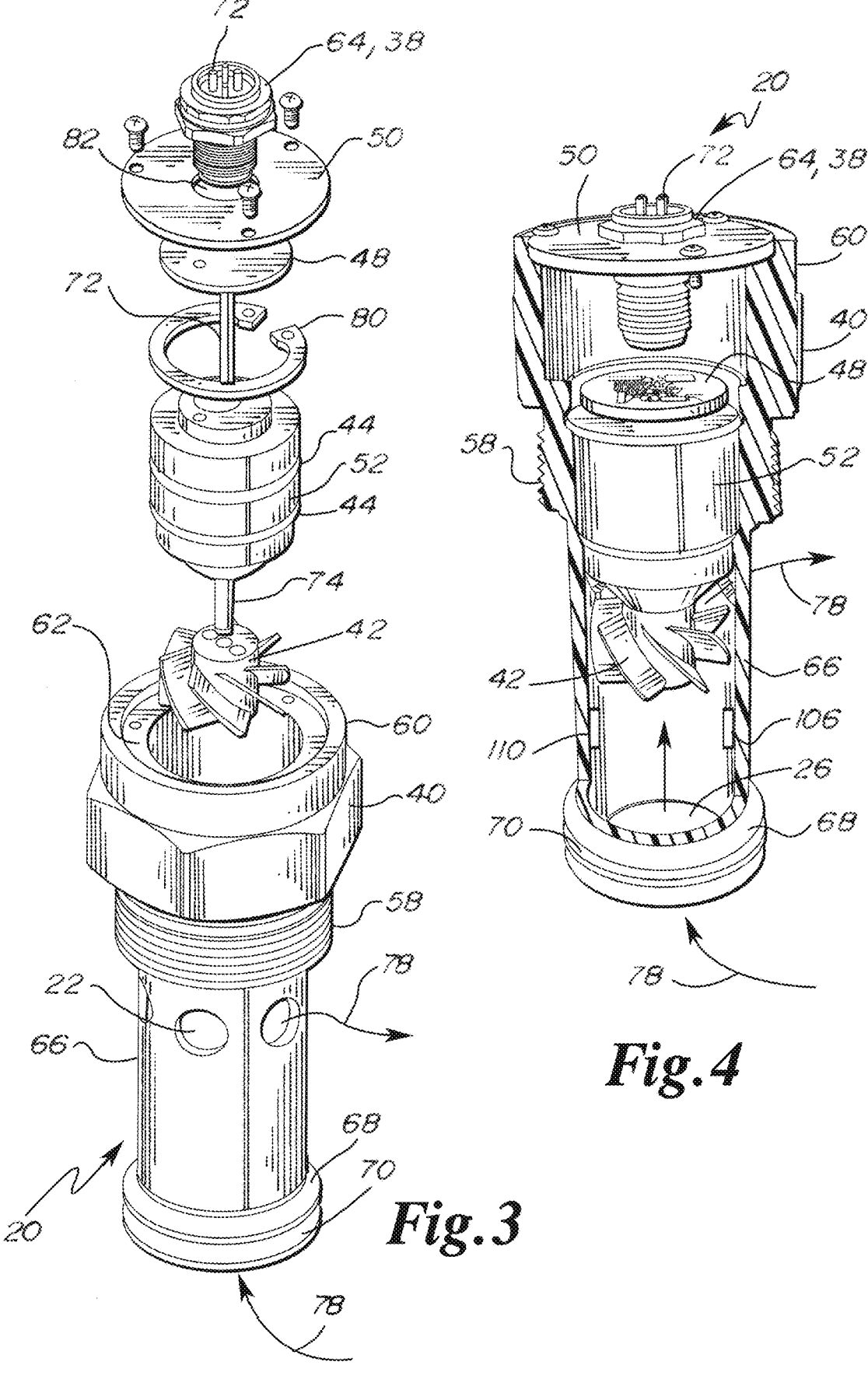
FIG. 3 is an exploded perspective view of one alternative embodiment of the cartridge style hydraulic flow sensor.
FIG. 4 is a cut-away view of one alternative embodiment of the cartridge style hydraulic flow sensor.

In at least one embodiment, as shown in FIG. 3, a positioning ring 80 may be located between the top of the Hall Effect Sensor 52 and the bottom of the platform 50 in surrounding engagement relative to the circuit board 48. FIG. 3 also shows that platform 50 has an central opening 82 which receives the electronic coupler 64.

In at least one embodiment, the cartridge style hydraulic flow sensor 20 is formed of an exterior structure which includes the head 60, circular ledge 62, body 40, mating threads 58, cylindrical casing 66 and base 68. An interior assembly is formed of the electronic coupler 64, platform 50, circuit board 48, Hall Effect Sensor 52, shaft 74 and impeller 42. The interior assembly is preferably positioned within the interior of the exterior structure, and is secured to the exterior structure by a plurality of mechanical fasteners which may be screws passing through the platform 50 and into the head 60.

In one embodiment as depicted in FIG. 3, the electric/communication leads 72 extend from the electronic coupler 64 to the circuit board 48. The circuit board 48 may also be in communication with the transmitter 38 which is used to communicate information or data to the remote controller/processor 76. In some embodiments, the impeller 42 is rotatably disposed on a shaft 74 where the impeller 42 is adjacent to the Hall Effect Sensor 52. In other embodiments, the shaft 74 may have an increased length dimension separating the impeller 42 from the bottom of the Hall Effect Sensor 52 by a desired dimension.

Referring to FIG. 4, the cartridge style hydraulic flow sensor 20 is shown with a portion of the head 60, body 40, mating threads 58 and cylindrical casing 66 cut away to show the impeller 42, Hall Effect Sensor 52, circuit board 48 and electronic coupler 64. As shown in FIG. 4 the impeller 42 is adjacent to the bottom of the Hall Effect Sensor 52.

In at least one embodiment, the impeller 42 may freely rotate about shaft 74 in either a clockwise or counterclockwise direction dependent on the direction of the fluid flow within a hydraulic circuit manifold 56. The direction of the revolution of the impeller 42 on the shaft 74 may alternatively be dependent upon the initial direction or orientation selected for the blades or fins.

In at least one embodiment, the cartridge style hydraulic flow sensor 20 is not required to couple to the hydraulic circuit manifold 56 in a vertical orientation. The cartridge style hydraulic flow sensor 20 may also be coupled to the hydraulic circuit manifold 56 in a horizontal direction, or an angular direction relative to either a vertical or a horizontal direction to sense fluid flow passage through a fluid conduit within the hydraulic circuit manifold 56.

The hydraulic circuit manifold 56 may be simple or very complex. In some embodiments the hydraulic circuit manifold 56 may include any number of valves 96, outlet fluid conduits 22, or inlet fluid conduits 26 and/or internal fluid flow conduits as required for a particular application. A cartridge style hydraulic flow sensor 20 may be in fluid flow communication within any desired conduit of a hydraulic system 84.

Fluid within the hydraulic circuit manifold 56 may flow upwardly as represented by arrow 78, contacting and rotating the blades or fins of the impeller 42, and then passing outwardly through the outlet fluid conduit 22 into a fluid flow conduit of the hydraulic circuit manifold 56.

As shown in FIG. 4 the circuit board 48 and transmitter 38 are proximate to the electronic coupler 64 and leads 72. In addition, the circuit board 48 is also proximate to the top of the Hall Effect Sensor 52.

In at least one embodiment, the Hall Effect Sensor 52 is connected electrically and is in communication with the circuit board 48 and transmitter 38. The circuit board 48 and transmitter 38 are also electrically connected and are in communication with the electronic coupler 64. The electronic coupler 64 through the use of the leads 72 is electrically connected and is in communication with an electrical power source and a remote controller/processor 76. The remote controller/processor 76 receives from circuit board 48 the sensed or calculated revolutions of the impeller 42 over the period of time.

The remote controller/processor 76 then performs an analysis of the received revolutions of the impeller 42 over the period of time, and inserts the number of revolutions of the impeller 42 into an equation for processing. The remote controller/processor 76 may also compare the received revolutions of the impeller 42 against pre-stored data. The remote controller/processor 76 determines the operational state of a hydraulic system 84. In general, the hydraulic system 84 will at least include a hydraulic circuit manifold 56 as well as a cartridge style hydraulic flow sensor 20 and a pump 86.

In some embodiments, the hydraulic circuit manifold 56 may receive a communication or command signal from a remote controller/processor 76 which in turn may open or close one of a plurality of valves 96 in communication with fluid flow conduits within the hydraulic circuit manifold 56. The communication between the cartridge style hydraulic flow sensor 20 and the remote controller/processor 76 enables an operator to determine if an adjustment is required to be made to the operational parameters of the pump 86 to increase or decrease the rate or volume of liquid flow entering the hydraulic circuit manifold 56 to be sensed by the cartridge style hydraulic flow sensor 20. The pump 86 is also electrically connected and is in communication with the remote controller/processor 76. The remote controller/processor 76 in turn may adjust a setting on the pump 86 in response to information received from the cartridge style hydraulic flow sensor 20 related to a fluid flow rate within the hydraulic circuit manifold 56.

The remote controller/processor 76 is not restricted to communications between the cartridge style hydraulic flow sensor 20 or hydraulic circuit manifold 56 and pump 86. The remote controller/processor 76 may additionally be in communication with any other elements of an hydraulic system 84 or other elements of a system or structure or machine which may be capable of regulation, control, adjustment, initiation and/or termination, to name a few. In addition, the remote controller/processor 76 may be in communication, and may monitor all functions of a hydraulic system 84 in real time, including but not necessarily limited to valves, flow meters and sensors. Further, the remote controller/processor 76 may include artificial intelligence software which is used to automatically issue command signals to components capable of control within a hydraulic system 84 to maximize fluid flow within the hydraulic system 84.

In at least one alternative embodiment, the communication between the cartridge style hydraulic flow sensor 20 through the electronic coupler 64 to the remote controller/processor 76 will occur through a wired connection. Alternatively, the connection through the electronic coupler 64 to the remote controller/processor 76 may pass initially to an intermediate communication hub through a wired connection, and then may be retransmitted by the intermediate communication hub to the remote controller/processor 76 through a wired connection or through a wireless connection such as through Bluetooth or Wi-Fi.

In an alternative embodiment, the electronic coupler 64 will include wireless communication capabilities for communication directly to the remote controller/processor 76 through a wireless media such as Bluetooth or Wi-Fi or by use of another wireless communication medium. In an alternative embodiment, the electronic coupler 64 may transmit a wireless communication to an intermediate communication hub. The intermediate communication hub may than re-transmit the communication to the remote controller/processor 76 through a wireless transmission or through a wired connection at the preference of an individual.

In an alternative embodiment, as shown in FIG. 5, the impeller 42 is engaged to the shaft 74. The shaft 74 extends upwardly traversing the top of the cartridge style hydraulic flow sensor 20 terminating with a connection to a gear 88. The rotation of the impeller 42 in response to fluid flow within the fluid flow conduit of the hydraulic circuit manifold 56 is translated to the rotation of the gear 88. It should be noted that the gear 88 may rotate in either a clockwise or counterclockwise direction resulting from the factors as earlier described.

In this alternative embodiment, at least one portion of the gear 88 includes magnetic material which will pass a Hall Effect Sensor 52 which is positioned proximate to the gear 88. The Hall Effect Sensor 52 will signal the rotations of the gear 88 relative to the Hall Effect Sensor 52 for communication to the circuit board 48 and transmitter 38, and for transmission to the remote controller/processor 76 through any of the alternative communication methods earlier described.

In the alternative embodiment depicted in FIG. 5, a cover 90 may be securely positioned in a covering relationship relative to the gear 88 in order to protect against any object or condition interfering with the free rotation of the gear 88.

In an alternative embodiment depicted in FIG. 5 and FIG. 6, the direction of the rotation of the gear 88 as connected to the shaft 74 and impeller 42 is represented by arrow 92. The separation of the gear 88 from the Hall Effect Sensor 52 enables the free rotation of the gear 88 relative to the sensor. It should be noted that gear 88 may be separated from Hall Effect Sensor 52 by any desired distance dependent on materials and size dimensions selected to form the gear 88, and the magnetic material integrated into the gear 88.

In at least one embodiment as depicted in FIG. 5, the cartridge style hydraulic flow sensor 20 includes a check valve 104 within the interior of the cylindrical casing 66. The check valve 104 functions to restrict the direction of fluid flow inwardly from the exterior of the base 68 towards the impeller 42 as depicted by reference numeral arrow 78. Alternatively, the check valve 104 functions to restrict the direction of fluid flow outwardly from the interior through the base 68 away from the impeller 42 as depicted by a direction opposite to reference numeral arrow 78. The check valve 104 will limit the direction of fluid flow to a single direction during use at any given time. In order to restrict the direction of fluid flow to an opposite direction, then the orientation of the check valve 104 will be required to be reversed, or the check valve 104 will need to be replaced. The check valve 104 may be located at any desired distance from the impeller 42 to prevent interference with the rotation of the impeller 42 during use. The check valve 104 may be positioned proximate to the base 68, immediately to the exterior of the base 68, or may act as a bottom surface for the cartridge style hydraulic flow sensor 20.

FIG. 6 also identifies the electrical communication between the Hall Effect Sensor 52 and the circuit board 48 and transmitter 38.

In at least one embodiment as shown in FIG. 7, a hydraulic circuit manifold 56 includes a number of cavities 54 each of which being in fluid flow communication with a fluid flow conduit 108 traversing hydraulic circuit manifold 56 in any desired direction.

Figures 8, 9, 10:
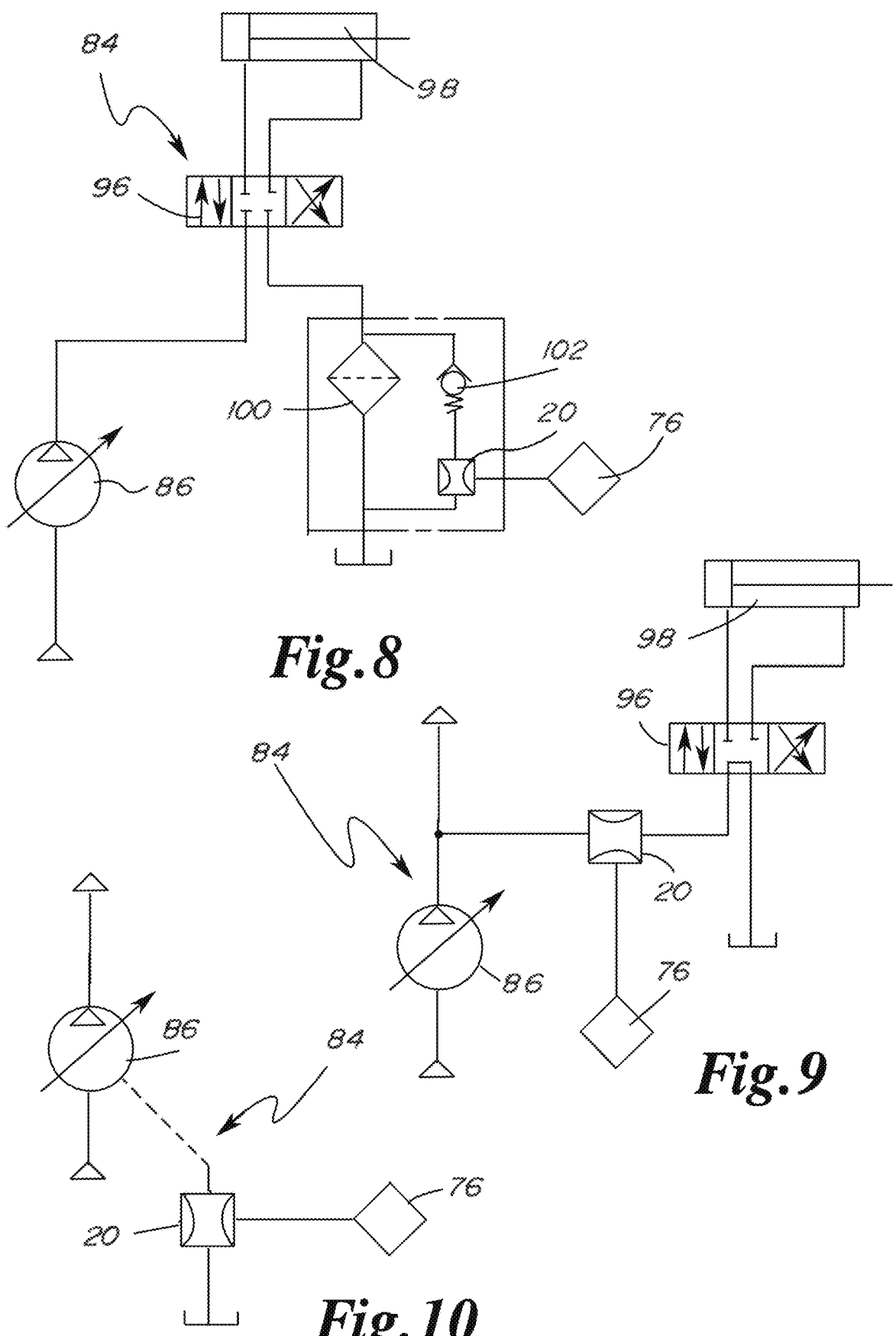
FIG. 8 is a schematic diagram of one alternative embodiment of the cartridge style hydraulic flow sensor within a hydraulic system.
FIG. 9 is a schematic diagram of one alternative embodiment of the cartridge style hydraulic flow sensor within a hydraulic system.
FIG. 10 is a schematic diagram of one alternative embodiment of the cartridge style hydraulic flow sensor within a hydraulic system.

In another alternative embodiment as depicted in FIG. 8, a schematic diagram of a hydraulic system 84 is shown when a cartridge style hydraulic flow sensor 20 is in fluid flow communication with a valve 96 within a hydraulic circuit manifold 56. The valve 96 may be in electric and in communication with a remote controller/processor 76 to regulate an operational status of the hydraulic system 84. In the embodiment shown in FIG. 8, the valve 96 is in communication with an actuator 98 which in turn is in communication with remote controller/processor 76. A command signal is transmitted from the remote controller/processor 76 for receipt by the actuator 98. The actuator 98 in turn opens, increases the opening, decreases the opening and/or closes the valve 96 in response to the received command signal.

In the embodiment depicted in FIG. 8, the hydraulic circuit manifold 56 and valve 96 are in fluid flow communication with a filter 100 and a bypass valve 102. The remote controller/processor 76 may be in communication with the bypass valve 102 in order to regulate the opening, partial opening, partial closing and/or closing of the bypass valve 102.

In the embodiment depicted in FIG. 8 a cartridge style hydraulic flow sensor 20 is in fluid flow communication with the filter 100 and the bypass valve 102 and/or the valve 96, and hydraulic circuit manifold 56, for receipt of fluid flow from any number of fluid flow conduits.

In the embodiment depicted in FIG. 8, the volume of fluid flow bypassing the filter 100 is an indication of the condition of the filter element. The more a filter element gets saturated with contaminants that are being removed from the fluid by the filter 100, the higher the rate of flow across the bypass valve 102. In this application, the cartridge style hydraulic flow sensor 20 can accurately monitor the condition of the filter element, insuring that the element is either still effective, or requires replacement.

In another alternative embodiment as depicted in FIG. 9, a pump 86 is in fluid flow communication with a cartridge style hydraulic flow sensor 20. The cartridge style hydraulic flow sensor 20 may additionally be in communication with a valve 96 of a hydraulic circuit manifold 56 and a remote controller/processor 76. The valve 96 of the hydraulic circuit manifold 56 is in communication with an actuator 98. The valve 96 regulates the opening, partial opening, partial closing and/or closing of the valve 96 of the hydraulic circuit manifold 56. The actuator 98 is in communication with the remote controller/processor 76 and will receive a command signal from the remote controller/processor 76 directing the modification of the operational status of the valve 96.

In another alternative embodiment as depicted in FIG. 10, a pump 86 is in fluid flow communication with a cartridge style hydraulic flow sensor 20 as part of a hydraulic circuit manifold 56. Alternatively, the cartridge style hydraulic flow sensor 20 may be directly plumbed into a hydraulic line. The cartridge style hydraulic flow sensor 20 is in communication with the remote controller/processor 76 which may be used to monitor the operational status of the hydraulic system 84 and to issue a communication signal to an operator in the event that the status of a hydraulic system 84 moves outside of an acceptable operational parameter. Alternatively, the remote controller/processor 76 may automatically send command signals to the pump 86 to maintain the operational status of hydraulic system 84 as sensed by the cartridge style hydraulic flow sensor 20.

The cartridge style hydraulic flow sensor 20 may be used as a component in a hydraulic system 84 which may have the representative function of monitoring hydraulic flow output; monitoring flow within a steering or break system for a vehicle; monitoring flow across a relief valve; or monitoring flow in a pump case drain. The above uses have been provided for illustrative purposes and should in no way be considered as limiting of the available uses of a cartridge style hydraulic flow sensor 20 within a fluid system or machine.

It should be noted that the hydraulic system 84 depicted in FIG. 8 through FIG. 10 represent an extremely small number of examples of the almost infinite number of hydraulic systems 84 which may include the use of a cartridge style hydraulic flow sensor 20 to monitor and signal the status of fluid flow through fluid flow conduits. The examples identified in FIG. 8 through FIG. 10 are not to be construed as in any way limiting of the use of the cartridge style hydraulic flow sensor 20.

Figure 11:
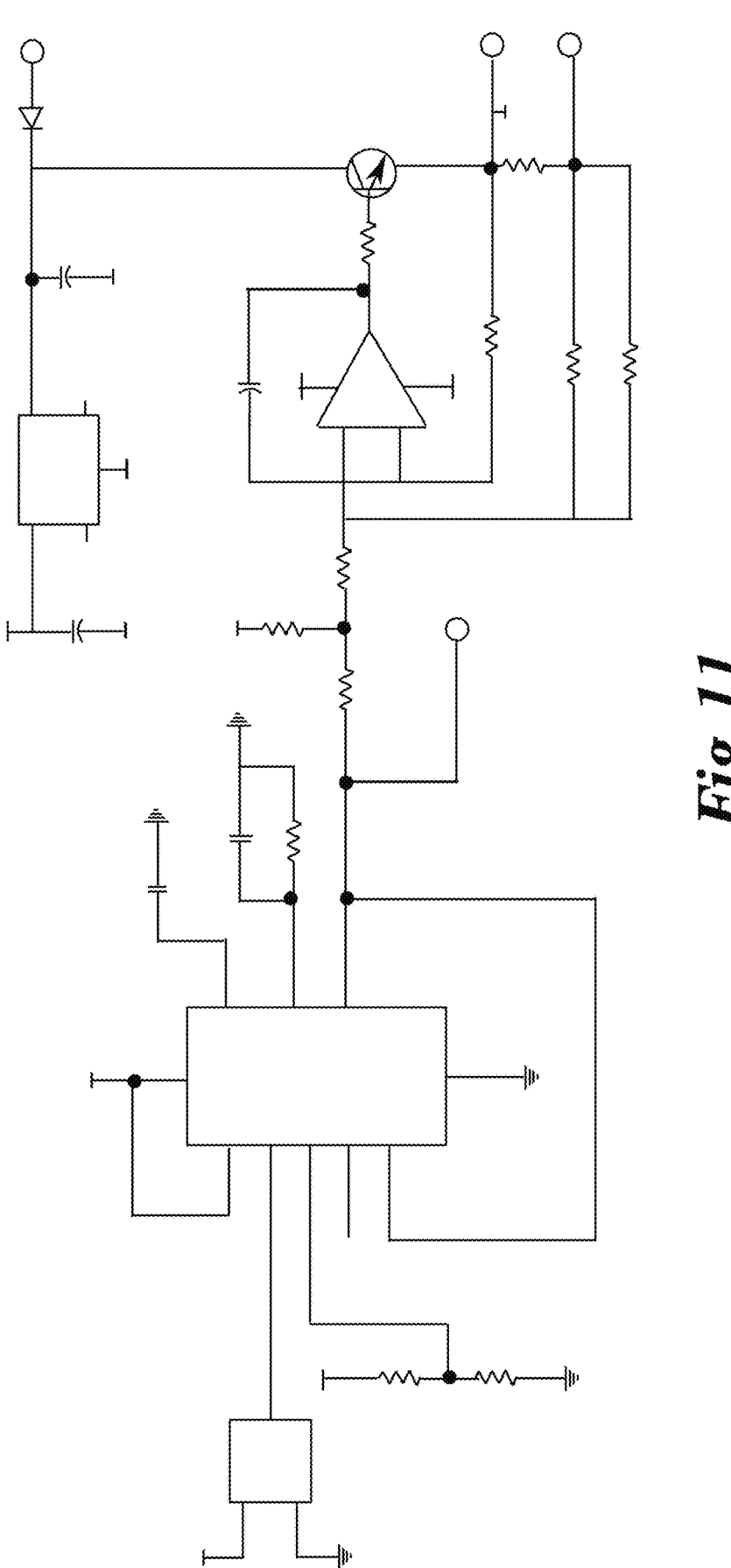
FIG. 11 is a circuit diagram of the electronic circuit of one alternative embodiment of the cartridge style hydraulic flow sensor.
Figures 12, 14:
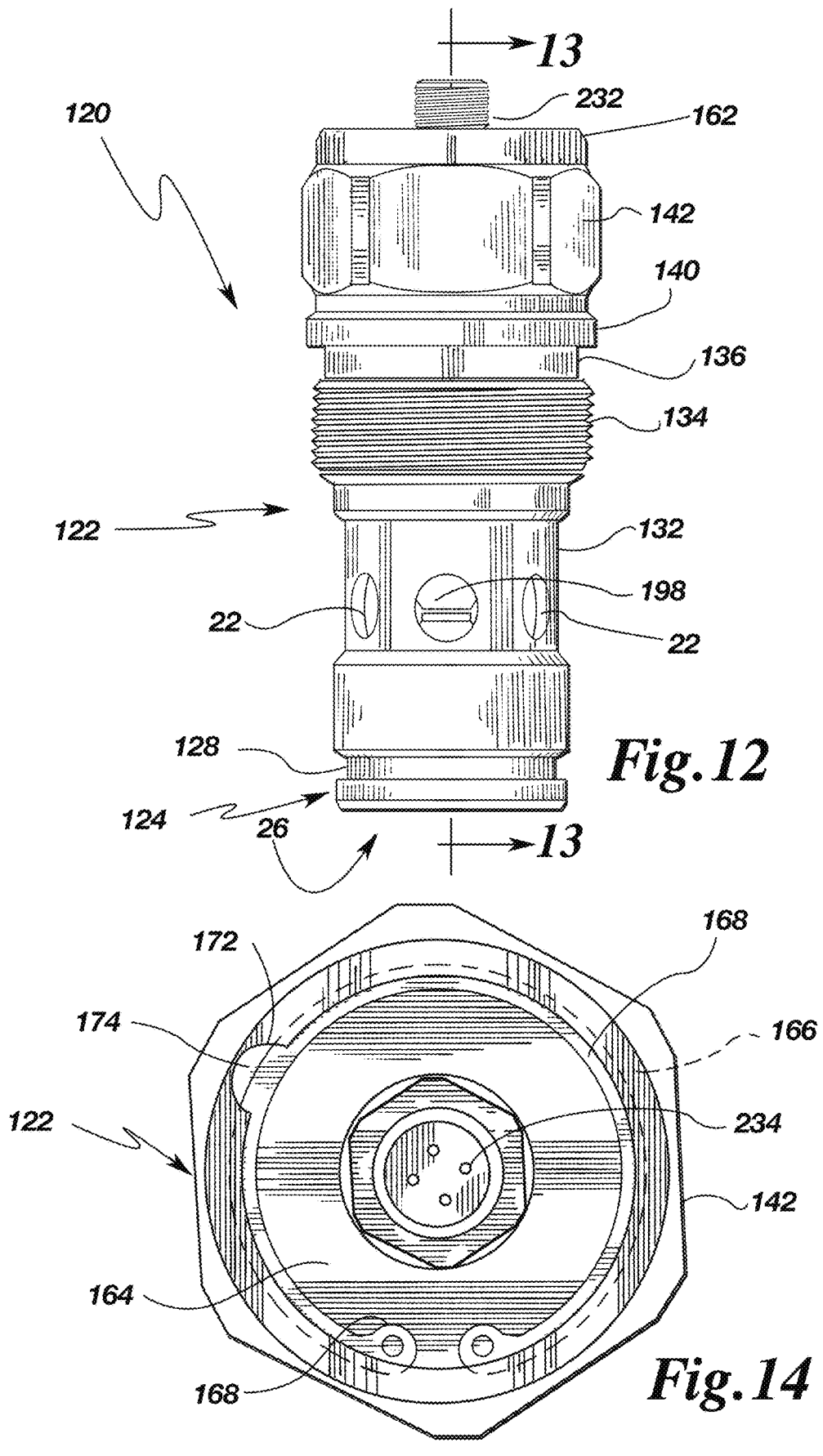
FIG. 12 is a side elevation view of one alternative embodiment of the programmable cartridge style hydraulic flow sensor.
FIG. 14 is a top plan view of one alternative embodiment of the programmable cartridge style hydraulic flow sensor taken along the line 14-14 of FIG. 13.
Figure 13:
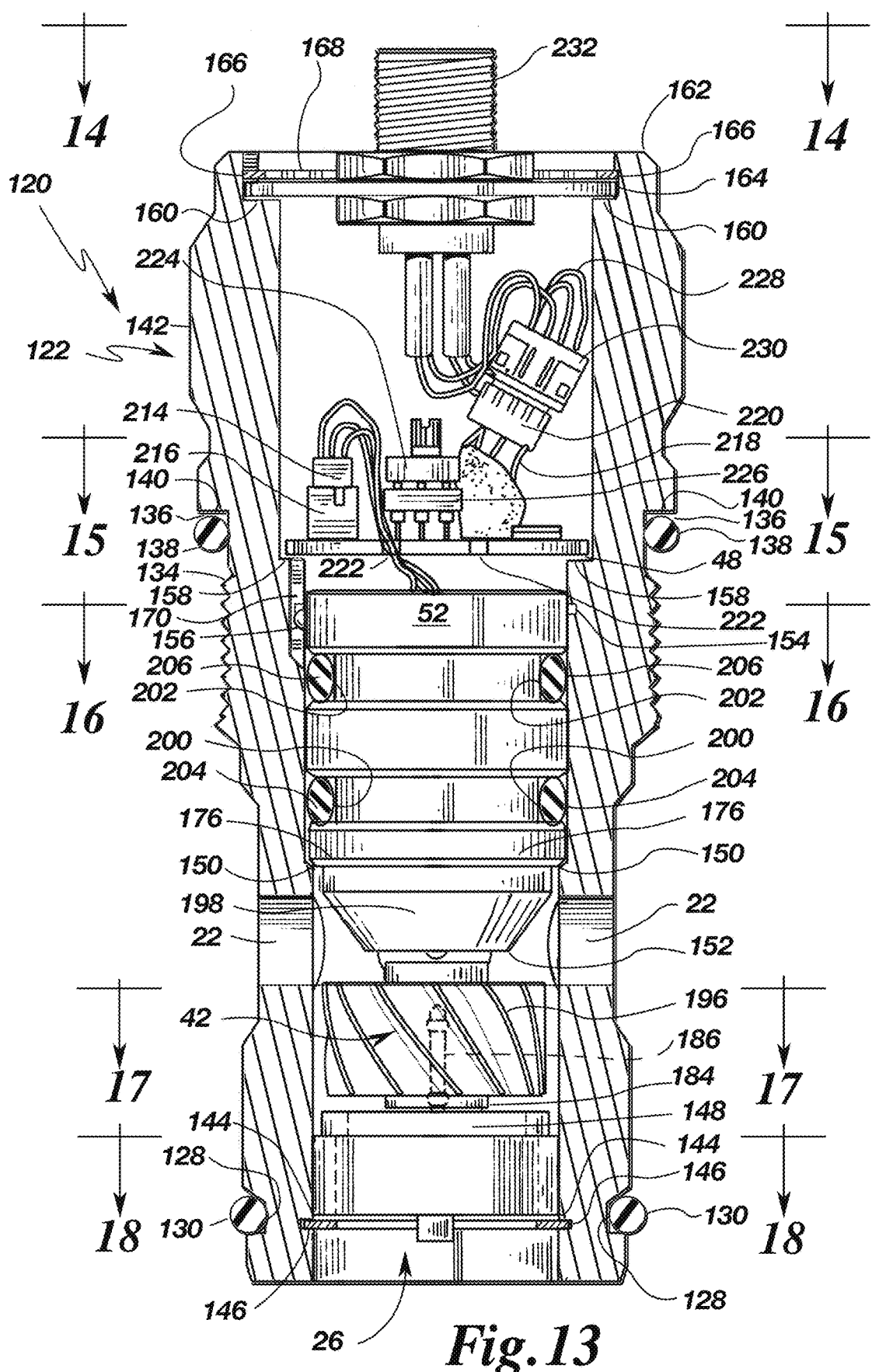
FIG. 13 is a cross-sectional side view of one alternative embodiment of the programmable cartridge style hydraulic flow sensor taken along the line 13-13 of FIG. 19.
Figures 15, 16, 17, 18:
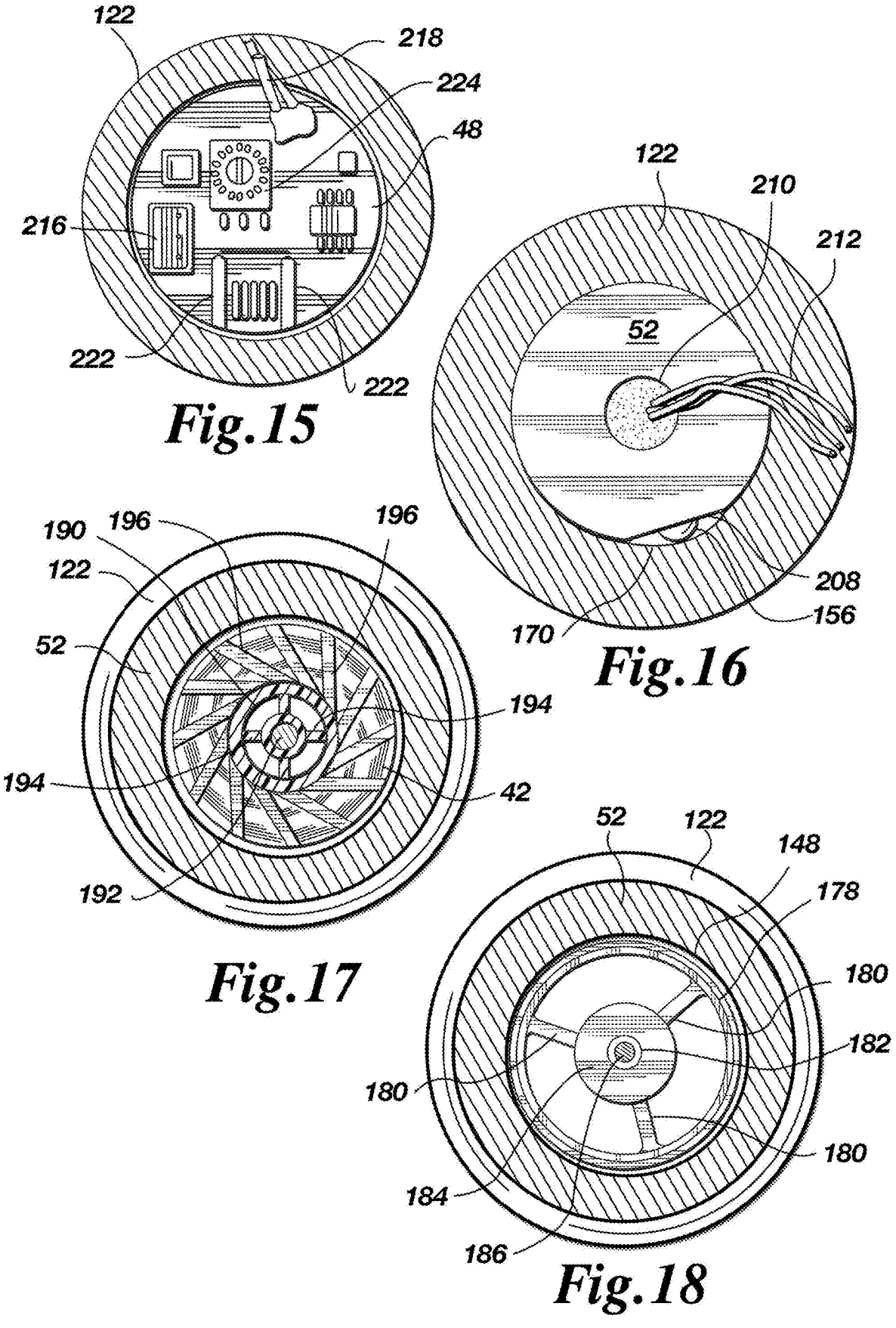
FIG. 15 is a cross-sectional top view of one alternative embodiment of the programmable cartridge style hydraulic flow sensor taken along the line 15-15 of FIG. 13.
FIG. 16 is a cross-sectional top view of one alternative embodiment of the programmable cartridge style hydraulic flow sensor taken along the line 16-16 of FIG. 13.
FIG. 17 is a cross-sectional top view of one alternative embodiment of the programmable cartridge style hydraulic flow sensor taken along the line 17-17 of FIG. 13.
FIG. 18 is a cross-sectional top view of one alternative embodiment of the programmable cartridge style hydraulic flow sensor taken along the line 18-18 of FIG. 13.
Figure 19:
FIG. 19 is an exploded perspective view of one alternative embodiment of the programmable cartridge style hydraulic flow sensor.

In one alternative embodiment, a circuit diagram is provided for the cartridge style hydraulic flow sensor 20 in FIG. 11. In one embodiment of the circuit used in the cartridge style hydraulic flow sensor 20, electrical pulse signals are converted from the Hall Effect Sensor 52 into a 4-20 milliamp output, which is also the wavelength of a common control signal.

In another alternative embodiment, the cartridge style hydraulic flow sensor 20 includes a pressure sensor 106 within the interior of the cylindrical casing 66. Alternatively, the pressure sensor 106 may be disposed on the exterior of the cylindrical casing 66 proximate to the base 68. The pressure sensor 106 is in communication with the circuit board 48 and transmitter 38 which will control the communication of a detected pressure within the hydraulic circuit manifold 56 or fluid conduit 108 to the remote controller/processor 76.

In one embodiment, following the receipt of the detected fluid pressure from the transmitter 38, the remote controller/processor 76 may manually or automatically disengage or activate a pump 86, or other component of a hydraulic system 84. In the event that the remote controller/processor 76 determines that the detected fluid pressure within the fluid conduit 108 or hydraulic circuit manifold 56 is above or below a desired fluid pressure, then the remote controller/processor 76 may automatically alter the status of a component of a hydraulic system 84 to increase or to decrease the fluid pressure within the fluid conduit 108 or hydraulic circuit manifold 56 to a desired level.

In another alternative embodiment, the cartridge style hydraulic flow sensor 20 includes a temperature sensor 110. The temperature sensor 110 may be located within the interior of the cylindrical casing 66. Alternatively, the temperature sensor 110 may be disposed on the exterior of the cylindrical casing 66 proximate to the base 68. The temperature sensor 110 is in communication with the circuit board 48 and transmitter 38 which will control the communication of a detected temperature within the hydraulic circuit manifold 56 or fluid conduit 108 to the remote controller/processor 76.

In one embodiment, following the receipt of the detected temperature of the fluid from the transmitter 38, the remote controller/processor 76 may manually or automatically engage or disengage a component to improve the operation of the hydraulic system 84. In the event that the remote controller/processor 76 determines that the detected fluid temperature within the fluid conduit 108 or hydraulic circuit manifold 56 is above or below a desired fluid temperature, then the remote controller/processor 76 may automatically alter the status of a component of a hydraulic system 84 to increase or to decrease the fluid temperature within the fluid conduit 108 or hydraulic circuit manifold 56 to a desired level.

In at least one embodiment, the transmitted readings from the Hall Effect Sensor 52, the temperature sensor 110, and the pressure sensor 106 may be used to verify the operational status of the components of the Hall Effect Sensor 52, the temperature sensor 110, and/or the pressure sensor 106 or the overall hydraulic system 84 by the controller processor 76. The controller processor 76 may continuously or periodically verify the accuracy of the readings from the Hall Effect Sensor 52 by performing a comparison or a calculation between sensed data and stored data in memory on the circuit board. The detection of a non-conforming parameter such as a temperature reading, a pressure reading, and/or a fluid volume flow reading may indicate the need to investigate, reset, repair and/or replace one or more of the components of the Hall Effect Sensor 52, pressure sensor 106, temperature sensor 110, the replacement of a fluid filter, the necessity to inspect a fluid system 84 for a leak, the existence of a non-functioning valve 96 or blockage of a fluid conduit 108 to name a few of the possible failure conditions or parameters which may be present in a fluid system 84. It should be noted that other types of failure or performance issues may be present, detectible and identified by the processor 76 for a fluid system 84 upon review of the sensed data values from the Hall Effect Sensor 52, pressure sensor 106 and temperature sensor 110 and that the conditions identified herein are a few examples of the problem issues which may be identified through use of the invention as described herein.

In at least one embodiment, sufficient electrical shielding is present between the circuit board 48, transmitter 38, Hall Effect Sensor 52, electronic coupler 64, leads 72, pressure sensor 106 and temperature sensor 110 to prevent electrical interference or feedback between the Hall Effect Sensor 52, pressure sensor 106 and temperature sensor 110 eliminating erroneous fluid flow, pressure and/or temperature measurements.

In at least one embodiment, the invention does not require that a fluid conduit 108 be cut or breached in order to insert a cartridge style hydraulic flow sensor 20 into, and the re-plumbing of, a fluid conduit 108. The cartridge style hydraulic flow sensor 20 is replaceable, removable and easily coupled within a cavity 54 of a hydraulic circuit manifold 56.

It should be noted that in one or more embodiments the materials selected to form the cartridge style hydraulic flow sensor 20 may vary. In some embodiments the cartridge style hydraulic flow sensor 20 may be formed of plastic material, metal materials such as steel or stainless steel materials, composite materials, coated materials, and other materials and combinations of materials dependent upon optimal performance considerations based on the overall size of the cartridge style hydraulic flow sensor 20 to be used and the types of fluid to pass through the cartridge style hydraulic flow sensor 20. It should be noted that the material selected to form the cartridge style hydraulic flow sensor 20 will not rust, decay or degrade and fail to operate for the intended purpose when used with a variety of fluids, even where some of the fluids are corrosive to some types of materials. It should also be noted that any particular component may be formed of any desired material for use in the cartridge style hydraulic flow sensor 20, and not all or the components are required to be formed of an identical material.

It should be noted that in one or more embodiments that the fluids to be monitored by the cartridge style hydraulic flow sensor 20 are not restricted to hydraulic (fluid power) applications. The cartridge style hydraulic flow sensor 20 may be easily utilized in any type of fluid conveying system, where monitoring the rate of fluid flow is desirable. Some limited examples of the types of fluids may include water based fluids, oil based fluids, flammable fluids, and chemical based fluids to name a few of the numerous types of fluids to be monitored within a fluid system.

In at least one alternative embodiment as shown in FIG. 12 through FIG. 19, the cartridge style hydraulic flow sensor is a programmable cartridge style hydraulic flow sensor 120. The programmable cartridge style hydraulic flow sensor 120 includes an outer casing 122 having a substantially cylindrical shape. The cylindrical or outer casing 122 includes a inlet fluid conduit 26 and an outlet fluid conduit 22 as earlier described. Fluid flow through the cylindrical or outer casing 122 is in the direction of arrow 78. (FIG. 1-FIG. 5)

In one embodiment, the base of the cylindrical or outer casing 122 is identified by reference numeral 124 which is located within the fluid conduit 108 of a hydraulic circuit manifold 56 in an operative position.

A first seal channel 128 is on the exterior of the cylindrical or outer casing 122 proximate to the base 124. The first seal channel 128 receives a first seal 130 which may be an O-Ring to restrict fluid passage to the exterior of the cylindrical or outer casing 122, directing fluid flow through the inlet fluid conduit 26. The first seal 130 is preferably positioned within the first seal channel 128 and is engaged to the interior surface of the fluid conduit 108 of the hydraulic circuit manifold 56 in an operative position.

In an alternative embodiment, an outlet section 132 is preferably located above the first seal channel 128. The outlet section 132 is the location for the placement of a plurality of outlet fluid conduits 22. In some embodiments the outlet section 132 may be recessed relative to the exterior surface of the remaining elements of the cylindrical or outer casing 122, having a smaller exterior diameter dimension.

In a preferred embodiment, attachment threads 134 may be disposed on the exterior of the cylindrical or outer casing 122 above the outlet section 132. The attachment threads 134 may releasably engage threads (not shown) which may be within the interior of the fluid conduit 108 proximate to the exterior of the hydraulic circuit manifold 56.

In at least one alternative embodiment, a second seal channel 136 is on the exterior of the cylindrical or outer casing 122 above the attachment threads 134. The second seal channel 136 receives a second seal 138 which may be an O-Ring to restrict fluid passage to the exterior of the cylindrical or outer casing 122, and leaking from the fluid conduit 108 of the hydraulic circuit manifold 56. The second seal 138 is preferably positioned within the second seal channel 136 and is engaged to the interior surface of the fluid conduit 108 of the hydraulic circuit manifold 56 in an operative position.

In a preferred embodiment, a casing manifold shoulder 140 is preferably immediately above the second seal channel 136. The casing manifold shoulder 140 functions as an upper compression surface against the second seal 138 during the tightening of the attachment threads 134 to the threads within the fluid conduit 108 of the hydraulic circuit manifold 56. The squeezing and the expansion of the second seal 138 between the casing manifold shoulder 140 and the exterior of the hydraulic circuit manifold 56 increases contact between the second seal 138 and the interior of the hydraulic circuit manifold 56 improving the fluid seal and reducing leakage therebetween.

Tightening surfaces 142 may be positioned above the casing manifold shoulder 140 to assist in the rotation of the cylindrical or outer casing 122 during releasable engagement of the cylindrical or outer casing 122 to the hydraulic circuit manifold 56.

In a preferred embodiment, the interior of the programmable cartridge style hydraulic flow sensor 120 and the cylindrical or outer casing 122 is preferably substantially cylindrical in shape.

In an alternative embodiment, a first positioning ring groove 144 is preferably disposed around the circumference of the interior of the cylindrical or outer casing 122 proximate to the base 124. The first positioning ring groove 144 receives a first positioning ring 146. The first positioning ring 146 functions as the lower support for the shaft or spindle assembly 148 within the interior of the cylindrical or outer casing 122. The first positioning ring 146 prevents the shaft or spindle assembly 148 from separating from the interior of the bottom of the cylindrical or outer casing 122.

In a preferred embodiment, a sensor shoulder 150 is provided on the interior circumference of the cylindrical or outer casing 122 above the first positioning ring groove 144. The shaft or spindle assembly 148 and the impeller 42 are preferably located between the first positioning ring 146 and the sensor shoulder 150. The sensor shoulder 150 functions as a positioning stop for the Hall Effect Sensor 52 above the impeller 42. The sensor shoulder 150 is a sufficient distance above the impeller 42 to prevent contact of the tip or lower surface 152 of the Hall Effect Sensor 52 with the upper surface of the impeller 42. The sensor shoulder 150 preferably engages a lower sensor ledge 176 on the Hall Effect Sensor 52, to restrict the descent of the Hall Effect Sensor 52 within interior of cylindrical or outer casing 122 during assembly of the programmable cartridge style hydraulic flow sensor 120.

In at least one alternative embodiment, a circumferential head grove 154 is placed around the circumference of the interior wall of the cylindrical or outer casing 122, and is preferably located above the sensor shoulder 150. In at least one embodiment the circumferential head groove 154 functions as a positioning location for a head nub 156 on the Hall Effect Sensor 52.

In some embodiments, a circuit board shoulder 158 extends inwardly from the interior circumference of the cylindrical or outer casing 122 above the circumferential head groove 154. The circuit board shoulder 158 functions as a positioning stop for the circuit board 48 above the Hall Effect Sensor 52. The circuit board shoulder 158 is a sufficient distance above the circumferential head groove 154 and Hall Effect Sensor 52 to prevent contact of the circuit board 48 with the upper surface of the Hall Effect Sensor 52.

In at least one embodiment, a cover shoulder 160 is located above the circuit board shoulder 158. The cover shoulder 160 extends around the circumference of the interior of the cylindrical or outer casing 122 proximate to the head or top 162. The cover shoulder 160 preferably positions a cover 164 a sufficient distance above the circuit board shoulder 158 and the circuit board 48 for the space between the lower surface of the cover 164 and the upper surface of the circuit board 48 to include connecting wires and other electronic components without risk of fracture.

In at least one embodiment, a second positioning ring groove 166 is placed into the circumference of the interior of the cylindrical or outer casing 122 immediately above the cover shoulder 160 and the cover 164, proximate to the head or top 162. A second positioning ring 168 is disposed in the second positioning ring groove 166 sandwiching the cover 164 between the second positioning ring 168 and the cover shoulder 160.

In at least one alternative embodiment, a vertical head channel 170 traverses the interior surface of the cylindrical or outer casing 122 between the circuit board shoulder 158 and the circumferential head groove 154, and a portion of the interior surface of the cylindrical or outer casing 122 below the circumferential head groove 154. The vertical head channel 170 provides space for the passing of the head nub 156 during the insertion of the Hall Effect Sensor 52 downwardly from the head or top 162 towards the impeller 42 within the interior of the cylindrical or outer casing 122.

In at least one embodiment, the interior of the head or top 162 includes a vertical cut-out guide 172 traversing the head or top 162 and extending downwardly to a location immediately above the cover shoulder 160. The cut-out guide 172 preferably facilitates the receipt of a tab 174 on the cover 164 for positioning of the cover 164 onto the cover shoulder

160. (FIG. 14) The cut-out guide 172 may also be vertically aligned with the vertical head channel 170.

In at least one embodiment a shaft or spindle assembly 148 is disposed within the interior of the cylindrical or outer casing 122 and is in contact with the first positioning ring 146. The shaft or spindle assembly 148 is substantially cylindrical in shape and is sized for contact with the interior wall of the cylindrical or outer casing 122. The shaft or spindle assembly 148 includes an enlarged circular base collar 178. (FIG. 18) A plurality of inwardly extending spindle supports 180 extend from the interior of the base collar 178 to a central column 182. The spindle supports 180 are integral with both of the base collar 178 and the central column 182. In some embodiments, three spindle supports 180 extend from the base collar 178 to the central column 182. In alternative embodiments, the number of spindle supports 180 integral with the base collar 178 and the central column 182 may be more or less than three depending on the requirements of a particular application.

In at least one embodiment the spindle supports 180 define a plurality of fluid flow passages between adjacent spindle supports 180 interior to the base collar 178.

In an alternative embodiment, a disc 184 is engaged to the central column 182 above the spindle supports 180. The disc 184 is preferably circular in shape and is centrally located within the interior of the cylindrical or outer casing 122. A spindle or shaft 186 extends upwardly from the center of the disc 184 and the central column 182. A shank of the spindle or shaft 186 (not shown) is within the interior of the central column 182. The spindle or shaft 186 preferably positions, and functions as the axis for rotation, for the impeller 42 about the spindle or shaft 186 during operation of the programmable cartridge style hydraulic flow sensor 120.

In a preferred embodiment the base collar 178, spindle supports 180, central column 182, and disc 184 may be formed of plastic or composite material. Alternatively other materials may be selected for the shaft or spindle assembly 148 dependent upon the requirements of a particular application including but not necessarily limited to non-corrosive materials when exposed to corrosive fluids. Alternatively the base collar 178, spindle supports 180, central column 182, and disc 184 may be formed of metal materials such as steel or stainless steel materials, composite materials, coated materials, and other materials and combinations of materials dependent upon optimal performance considerations for the programmable cartridge style hydraulic flow sensor 120 during use.

In an alternative preferred embodiment, the spindle or shaft 186 is formed of sturdy materials such as metal materials such as steel or stainless steel materials, composite materials, coated materials, and other materials and combinations of materials so long as the spindle or shaft 186 functions as the axis of rotation for the impeller 42 without restricting rotation of the impeller 42 during use.

In at least one embodiment, the impeller 42 is preferably rotatably engaged to the spindle or shaft 186 and functions as described herein. The impeller 42 preferably includes a plurality of shaped fins or blades 196 which upon contact with fluid flow, cause the impeller 42 to freely rotate about the spindle or shaft 186. In one embodiment, the impeller 42 may be formed of plastic or composite material. Alternatively other materials may be selected for the impeller 42 dependent upon the requirements of a particular application including but not necessarily limited to non-corrosive materials when exposed to corrosive fluids. The impeller 42 may include internal bearings for engagement to the spindle or shaft 186, to facilitate free rotation between the impeller 42 and spindle or shaft 186.

In at least one embodiment, the top surface of the impeller 42 may be embedded with two slugs 188 of magnetic material. The slugs 188 are preferably aligned and are positioned on opposite sides of the top surface relative to the spindle or shaft 186.

In at least one alternative embodiment, the bottom or lower portion of the impeller 42 may include a circular outer support 190, an interior circular spindle or shaft receiver 192, and a plurality of support ribs 194 extending between the circular outer support 190 and the spindle or shaft receiver 192. It should be noted that the impeller 42 may rotate about the spindle or shaft 186 in either direction.

In at least one embodiment, the Hall Effect Sensor 52 is substantially cylindrical in shape and is sized for placement within the interior of the cylindrical or outer casing 122. The Hall Effect Sensor 52 includes a partially conical lower portion 198 terminating at a flat tip or lower surface 152. The tip or lower surface 152 is disposed adjacent to the top of the impeller 42 establishing a desired sensor/impeller separation dimension. The Hall Effect Sensor 52 includes a circular lower sensor ledge 176 above the partially conical lower portion 198. The lower sensor ledge 176 is in contact with the sensor shoulder 150 when the Hall Effect Sensor 52 is positioned proximate to the impeller 42.

In at least one alternative embodiment, the Hall Effect Sensor 52 includes a central portion having a third seal channel 200 and a fourth seal channel 202. A third seal 204 and a fourth seal 206 are preferably disposed in the respective third and fourth seal channels 200 and 202 respectively. The third seal 204 and fourth seal 206 may be O-rings which are in flush contact with the interior wall of the cylindrical or outer casing 122 providing a fluid seal, and preventing fluid from rising within the interior of the cylindrical or outer casing 122 above the lower sensor ledge 176.

The Hall Effect Sensor 52 is preferably formed of non corrosive metallic material which does not adversely effect the performance of the sensor in detecting the rate of fluid flow within conduits of a fluid system.

In at least one embodiment, the portion of the Hall Effect Sensor 52 immediately above the fourth seal channel 202 includes a flat seat 208. The head nub 156 is preferably disposed centrally on the seat 208. The head nub 156 is aligned with the vertical head channel 170 during the downward insertion of the Hall Effect Sensor 52 within the cylindrical or outer casing 122 into an operative position. The Hall Effect Sensor 52 is inserted from the head or top 162 toward the base 124 until the lower sensor ledge 176 contacts the sensor shoulder 150. In this position, the head nub 156 will be aligned with and positioned in the circumferential head groove 154.

In at least one alternative embodiment the top of the Hall Effect Sensor 52 is circular in shape with the exception of the flat seat 208. A sensor opening 210 is preferably located centrally through the top of the Hall Effect Sensor 52 to provide a passage of electrical wires 212 having a suitable electrical connector 214 upwardly to the exterior of the Hall Effect Sensor 52.

In some embodiments, upon the engagement of the lower sensor ledge 176 to the sensor shoulder 150 a first internal gap is established above the top of the Hall Effect Sensor 52 and the circuit board shoulder 158. The first internal gap is preferably of sufficient size to hold a portion of the electrical wires 212 and any electrical components descending from the bottom of the circuit board 48.

In at lease one preferred embodiment, a circuit board 48 is inserted into the interior of the cylindrical or outer casing 122 and positioned into contact with the circuit board shoulder 158, following insertion of the Hall Effect Sensor 52 within the interior of the cylindrical or outer casing 122. The circuit board 48 is a printed circuit board including a microprocessor 226, a multi-position selector switch 224 on the upper surface of the printed circuit board, and other electronic components as required on either the top or bottom of the printed circuit board as convenient for a particular application. The top of the printed circuit board includes a receiving connector 216 for releasable engagement to connector 214 of the Hall Effect Sensor 52. In addition the top of the circuit board 48 includes connection wires 218 having interface connector 220.

In addition, printed circuit board 48 preferably includes at least one slot passage 222. The slot passage 222 receives the electrical wires 212 from the Hall Effect Sensor 52 enabling the connector 214 to pass upwardly past the circuit board 48 for coupling of the connector 214 to the receiving connector 216.

In a preferred embodiment the circuit board 48 includes on the upper surface a multi-position selector switch 224. The selector switch 224 enables an individual to select up to eight, or more, independently programmed and/or stored flow passage rates, and one of two voltage outputs for sensing by the Hall Effect Sensor 52 following positioning of the cylindrical or outer casing 122 within a conduit of a hydraulic circuit manifold 56.

In at least one embodiment the flow passage rates may be 10, 15, 20, 25, 50, 75, 100 & 125 gallons per minute, and the voltage outputs may by either 0.5-5 vdc or 1-10 vdc. The flow passage rates and/or the voltage outputs may be conveniently selected by manipulation of the selector switch 224 either before or after the programmable cartridge style hydraulic flow sensor 120 is installed into the a hydraulic circuit manifold 56 or other fluid system. Available flow options may selected though the manipulation of the rotatable dial or selector switch 224 as incorporated into the top of the circuit board 48.

In some embodiments, upon the engagement of the circuit board 48 to the circuit board shoulder 158 a second internal gap is established above the top of the circuit board 48 and below the cover 164. The second internal gap is preferably of sufficient size to hold the connection wires 218, the interface connector 220 and any other electrical components extending upwardly from the circuit board 48.

In at least one embodiment the programmable cartridge style hydraulic flow sensor 120 includes a removable cover 164 which is releasable secured between the cover shoulder 160 and the second positioning ring 168 proximate to the head or top 162. The cover 164 is preferably formed of metallic material and may be formed of non-corrosive metallic or other materials as identified herein dependent upon the requirements of a particular application.

The cover 164 includes the tab 174 which is aligned with the cut-out guide 172 during the positioning of the cover 164 onto the cover shoulder 160, and the engagement of the second positioning ring 168 into the second positioning ring groove 166 to secure the cover 164 to the cylindrical or outer casing 122.

In at least one alternative embodiment, cover wires 228 descend from the bottom of the cover 164 into the second internal gap. A coupling connector 230 is engaged to the end of the cover wires 228. The coupling connector 230 is preferably engaged to the interface connector 220 of the circuit board 48. The cover wires 228 preferably traverse through a centrally disposed cover wire passage 232 and are electrically connected to a communication connector 234 extending upwardly from the top of the cover 164. The communication connector 234 may include a plurality of connection prongs at the preference of an individual. In one embodiment a four prong connection may be provided for the communication connector 234, where prong 1 is a DCV OUT, prong 2 is a DCV IN, prong 3 is reserved, and prong 4 is Common.

Following assembly of the programmable cartridge style hydraulic flow sensor 120 and the engagement of the programmable cartridge style hydraulic flow sensor 120 to a hydraulic circuit manifold 56, and the initiation of operation of a fluid system, the Hall Effect Sensor 52 will sense a fluid passage rate and will communicate an electrical signal representative of the sensed fluid passage rate over the electrical wires 212, through the connector 214, to the receiving connector 216 and then to the microprocessor 226 on the circuit board 48. A previously selected setting for the selector switch 224 will direct the sensed fluid passage rate to the appropriate data/processing algorithm on the circuit board 48 for analysis to determine compliance with the previously selected setting, or the necessity for a increase or decrease of the fluid passage rate within the hydraulic system 84 to comply with the previously selected setting. The determination of fluid flow rate adjustment will then be electrically communicated from the connection wires 218 to the interface connector 220 and into the coupling connector 230 and cover wires 228 for communication through the communication connector 234 to an appropriate electrical display or receiver as part of a hydraulic system control. An individual may then adjust the fluid passage rate as required. Alternatively, the fluid flow rate may be automatically adjusted in response to the communicated fluid flow rate.

In at least one alternative embodiment, the cover 164 may be released from the cylindrical or outer casing 122 and the coupling connector 230, and may be disconnected from the interface connector 220. An individual may then manipulate the selector switch 224 into a different setting for the programmable cartridge style hydraulic flow sensor 120.

Alternatively an individual may connect a programming device to the circuit board 48 through connection to the interface connector 220. An individual may then reprogram the memory/processing algorithms for the microprocessor 226 of the circuit board 48 to establish alternative fluid passage rates for detection by the programmable cartridge style hydraulic flow sensor 120.

The circuit board 48 for the programmable cartridge style hydraulic flow sensor 120 will in some embodiments function utilizing the same operations as earlier described for the cartridge style hydraulic flow sensor 20.

Perhaps even more advantageous is that the microprocessor 226 may also be pre-programmed at the time of manufacture to modify any of the flow ranges to a specific setting and as well as the output signal. The microprocessor 226 may also be modified to generate a current output (milliamps) or strictly a pulse output as required for a particular application. Programming of the microprocessor 226 may be accomplished through the use of a docking station designed to mate with the printed circuit board 48 prior to final assembly.

In addition, programming of the microprocessor 226 may be modified at a later date by removal of the cover 164 and the engagement of a docking station to a portable or to a desk top personal computer and then connection to the interface connector 220. The docking station and circuit board 48 enable customized programming of the microprocessor 226 to satisfy the requirements of a particular application.

In at least one embodiment it is anticipated that the programmable cartridge style hydraulic flow sensor 120 will function without fail when a fluid within a fluid system traversing through the programmable cartridge style hydraulic flow sensor 120 has an operating temperature of between approximately-20 degrees C. and up to approximately 125 degrees C. It is also anticipated that the programmable cartridge style hydraulic flow sensor 120 is pressure resistant up to approximately 5000 psi. The programmable cartridge style hydraulic flow sensor 120 may also have an accuracy of +/−. 5% over the identified full range of operating temperatures and pressures identified herein.

It is also anticipated that the fluid within the system including the programmable cartridge style hydraulic flow sensor 120 will be Hydraulic Fluids, Transmission Fluids, Oil-in-Water Emulsions, Water and Glycol Mixtures, and Skydrol™ and combinations thereof.

Figure 23:
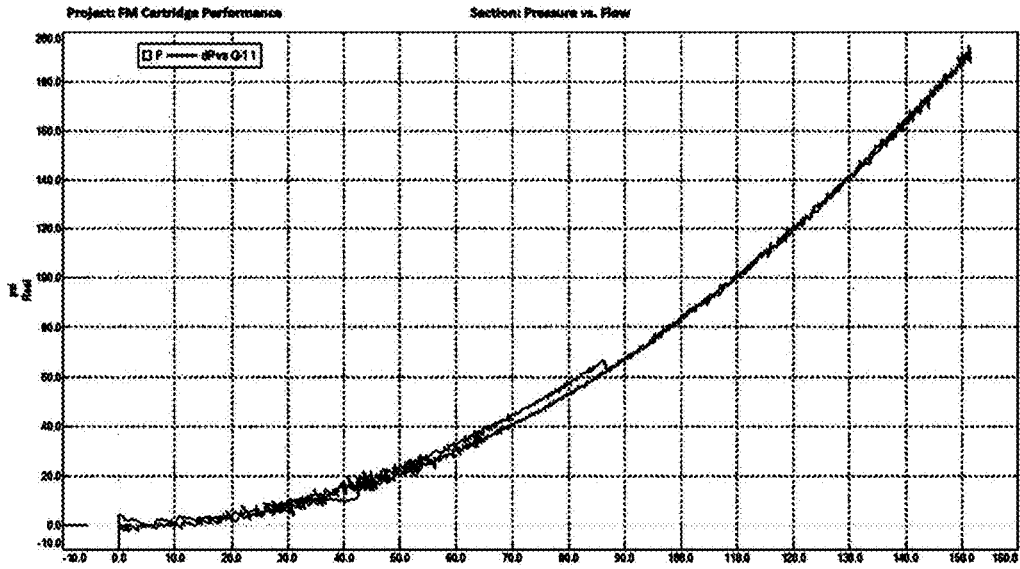
FIG. 23 is a voltage chart of one alternative embodiment of the cartridge style hydraulic flow sensor.

In some embodiments the cylindrical or outer casing 122 is formed of stainless steel material and the sealing material is formed of Buna, however other materials may function without fail for particular applications. It is anticipated that the input voltage for the programmable cartridge style hydraulic flow sensor 120 will be approximately 12 to 30 VDC and the output voltage will be approximately 0.5 to 5 V or 1-10 V as identified in Chart "A" of FIG. 23.

In at least one embodiment the programmable cartridge style hydraulic flow sensor 120 will have an overall length dimension from the base 124 to the tip of the communication connector 234 of approximately 5.03 inches or 128.22 centimeters. The width dimension for the interior of the cylindrical or outer casing 122 is approximately 1.62 inches or 41.2 centimeters.

Figure 24:
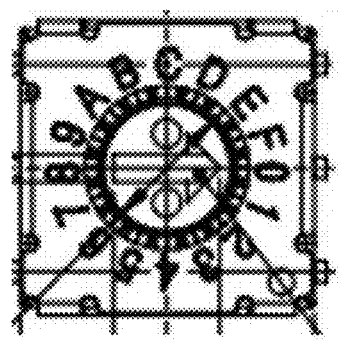
FIG. 24 is a pressure flow rate graph of one alternative embodiment of the cartridge style hydraulic flow sensor.

The performance of the programmable cartridge style hydraulic flow sensor 120 in view of varying pressure and flow rate conditions is identified below in Graph "A" of FIG. 24. In the FIG. 24 the real pressure in PSI is indicated on the Y-axis and the Flow Rate in Gallons Per Minute (gpm) is indicated on the X-axis.

Figure 20:
FIG. 20 is an exploded perspective view of one alternative embodiment of the cartridge style hydraulic flow sensor.
Figure 21:
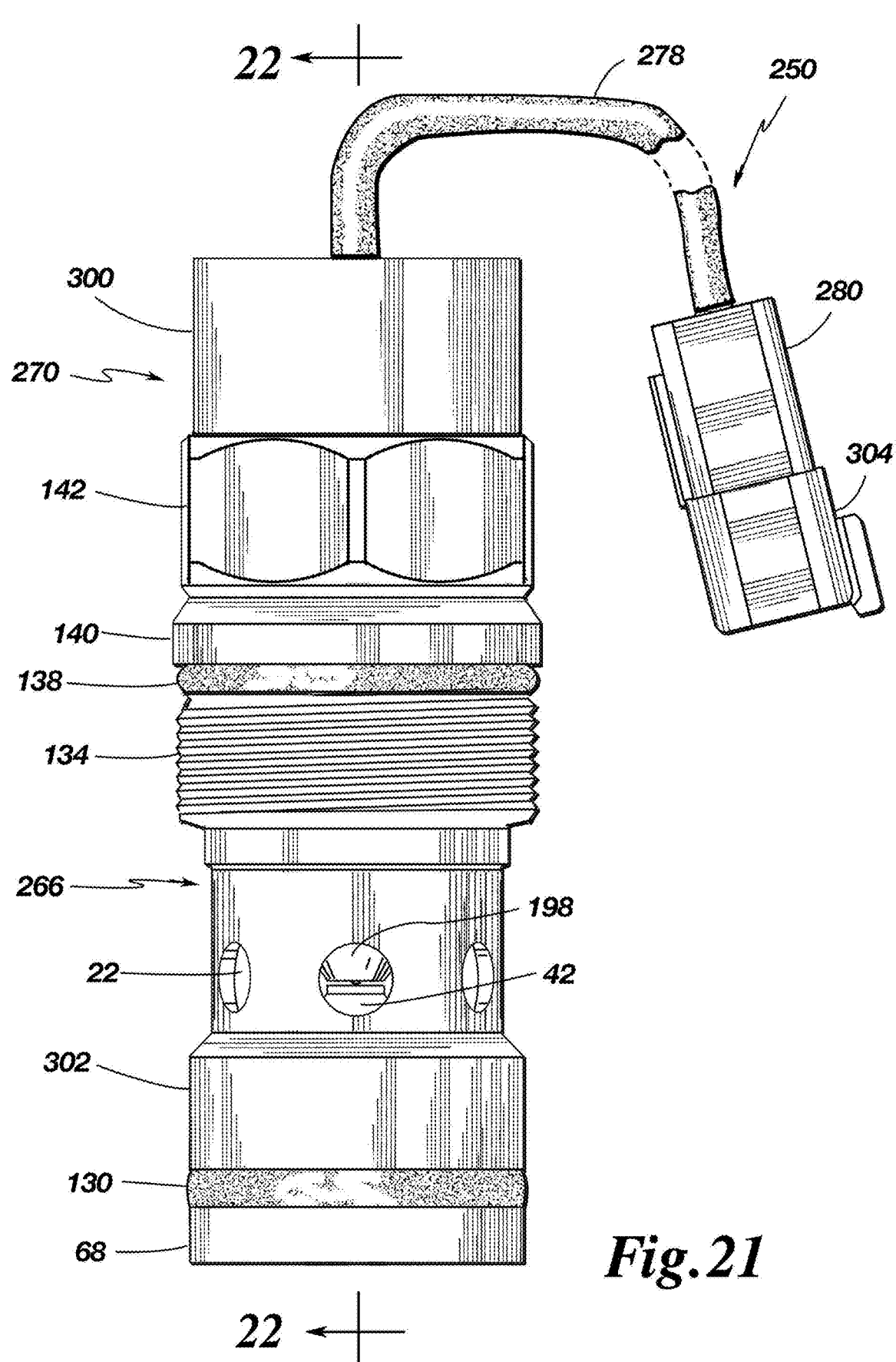
FIG. 21 is a side elevation view of one alternative embodiment of the cartridge style hydraulic flow sensor.
Figure 22:
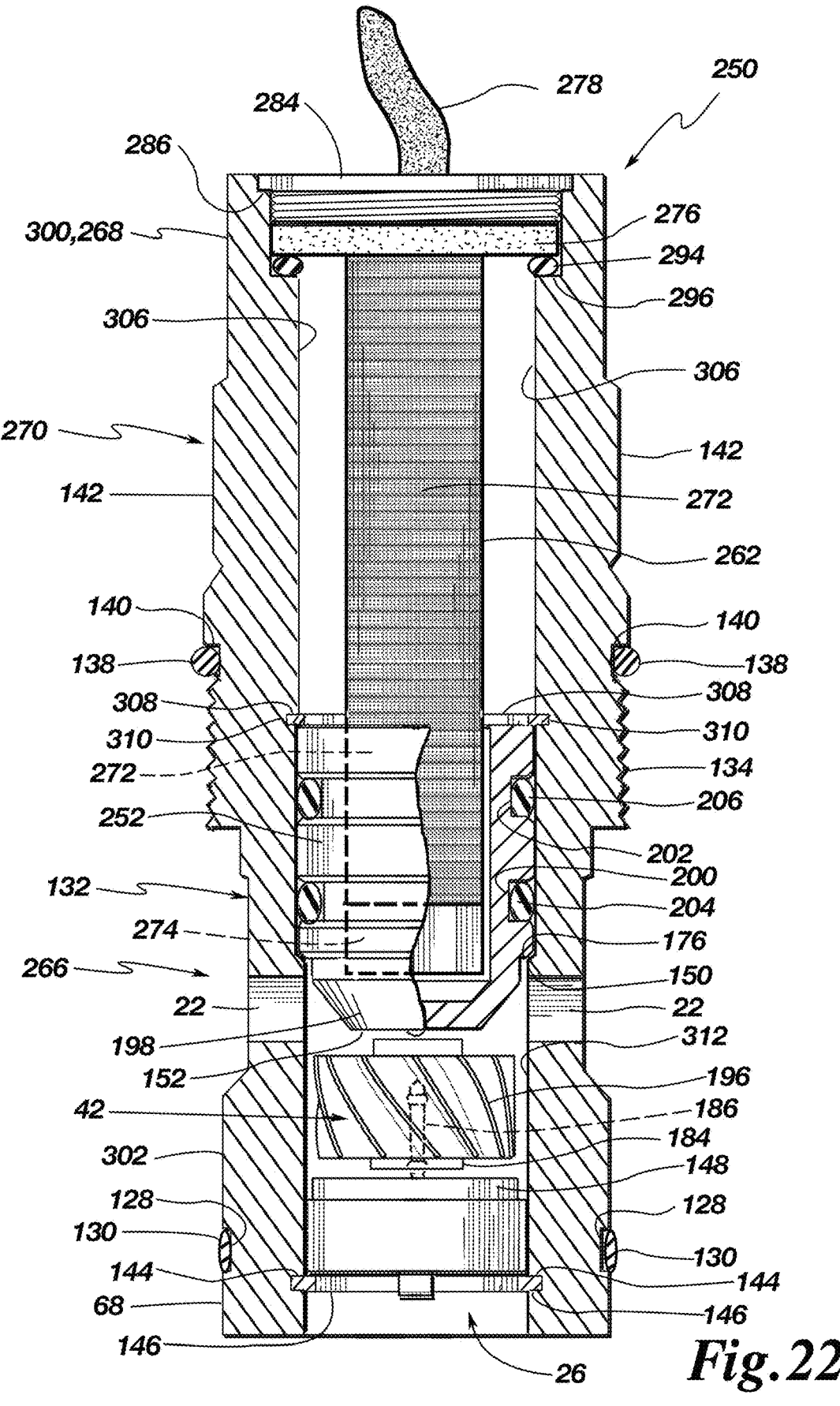
FIG. 22 is a cross-sectional side view and partial cut-away side view of one alternative embodiment of the cartridge style hydraulic flow sensor taken along the line 22-22 of FIG. 21.

In an alternative embodiment the cartridge style hydraulic flow sensor 250 is shown in FIGS. 20-22. With respect to the cartridge style hydraulic flow sensor 250, like reference numerals will be used with corresponding elements as previously described, the previous disclosure being incorporated by reference, and not duplicated except as necessary to fully understand an alternative embodiment of the invention.

Referring to FIG. 20, in at least one alternative embodiment, the cartridge style hydraulic flow sensor 250 includes an impeller 42 and a shaft or spindle assembly 148 having the features and functions as previously described.

In a preferred embodiment, the cartridge style hydraulic flow sensor 250 includes a sensor housing 252. Sensor housing 252 preferably includes a centrally disposed housing bore 254 establishing an interior housing wall 256 and an exterior housing wall 258.

The sensor housing 252 also preferably includes a housing top 260 and a partially conical lower portion 198 having a tip or lower surface 152. The functions and features of the partially conical lower portion 198 and the tip or lower surface 152 being previously described. The sensor housing 252 may also include a seat 208 and head nub 156 as previously described.

In at least one embodiment, the interior housing wall 256 is a smooth surface without structure and is sufficiently large in diameter to removably receive the lower portion 264 of an elongate cylindrically shaped encoder/Hall Effect Sensor 262.

In an alternative embodiment, the exterior housing wall 258 includes the elements of the third seal channel 200, fourth seal channel 202, third seal 204, and the fourth seal 206 having the functions and features as previously described. The exterior housing wall 258 in a preferred embodiment, forms a fluid seal with respect to the upper cartridge interior wall 306 and the lower cartridge interior wall 312, preventing fluid within a hydraulic system 84 from advancing upwardly, or outwardly beyond the third seal 204 into the interior of the upper section 270 holding the main body of the encoder/Hall Effect Sensor 262.

As earlier described, fluid enters the cartridge style hydraulic flow sensor 250 as indicated by arrow 26, flowing past the shaft or spindle assembly 148 and the impeller 42 for exit from the outlet fluid conduits 22 as depicted by arrow 78. As previously described the direction of fluid flow within the cartridge style hydraulic flow sensor 250 may be reversed or opposite to the direction indicated for arrow 26 and arrow 78.

In some alternative embodiments, the encoder/Hall Effect Sensor 262 includes an elongate cylindrical outer case 272 and a lower cap 274. The lower cap 274 in the assembled configuration is in contact with the interface or junction between the bottom of the interior housing wall 256 and the top of the partially conical lower portion 198. The dimensions selected for the partially conical lower portion 198 and the gap between the tip or lower surface 152 and the slugs 188 is sufficiently small to not adversely impact the detection of the revolutions of the impeller 42 about the shaft or spindle 186 by the encoder/Hall Effect Sensor 262 during the flow of fluid through the cartridge style hydraulic flow sensor 250 as disposed within a cavity 54 or a fluid conduit 108 of a hydraulic circuit manifold 56.

In at least one alternative embodiment, a circuit board, electronics, and/or microprocessor are disposed within the interior of the outer case 272. In at least one embodiment the encoder/Hall Effect Sensor 262 is a J1939 flow sensor as available from Jorel LLC of Wisconsin.

In some alternative embodiments, the circuit board, electronics, and/or microprocessor of the encoder/Hall Effect Sensor 262 are configured to detect two hundred revolutions of the impeller 42 per gallon of fluid per minute as passing through the cartridge style hydraulic flow sensor 250. The encoder/Hall Effect Sensor 262 in an alternative embodiment may be configured to detect any number, or range of numbers, of revolutions of the impeller 42 per volume of fluid through the cartridge style hydraulic flow sensor 250 as required for a particular application. In at least one alternative embodiment, the number of revolutions of the impeller 42 will be between 1 and 2000 per 0.001 gallons to 150 gallons of fluid passing through the cartridge style hydraulic flow sensor 250 per minute.

In some alternative embodiments, the cartridge style hydraulic flow sensor 250 is pressure resistant up to 6000 psi and may sense temperatures of fluid within a range of −20 degrees C. to 125 degrees C. The cartridge style hydraulic flow sensor 250 may also include a pressure sensor 106 and/or a temperature sensor 110 as previously described.

The materials used to form the cartridge style hydraulic flow sensor 250 are identical to the materials as previously identified. The cartridge style hydraulic flow sensor 250 may have an input voltage of between 12 and 30 VDC. The signal output may communicate with a J1939 CAN-Bus and include a Deutsch Series Connector.

Continuing to refer to FIG. 20 the encoder/Hall Effect Sensor 262 is preferably shaped as an elongated cylinder having a diameter dimension for removable insertion within the housing bore 254 of the sensor housing 252. The encoder/Hall Effect Sensor 262 at the top includes an upper support plate 276 having a centrally disposed aperture which allows passage of a wire harness 278 having a wire harness connector 280. The wire harness 278 is preferably in electrical communication with the circuit board, electronics, and/or microprocessor within the interior of the outer case 272 of the encoder/Hall Effect Sensor 262.

In at least one embodiment, the wire harness connector 280 is a J1939 compatible penetrating or receiving connector dependent upon the requirements of a particular application.

In a preferred embodiment, the cartridge style hydraulic flow sensor 250 includes a ringed connector 282. The ringed connector 282 includes an attachment positioning ledge 284. The attachment positioning ledge 284 when in the fully engaged operative position is proximate to, or is in contact with, an outer casing connector support shoulder 286. The outer casing connector support shoulder 286 functions as a stop or position limiter restricting insertion of the ringed connector 282 within the cylindrical or outer casing 268. The ringed connector 282 also includes ringed connector threads 288 having a bottom pressing surface 290. In at least one alternative embodiment, the ringed connector 282 on the interior surface includes a pair of ringed attachment grooves 292 which are aligned with, and are on opposite sides of, a diameter for the ringed connector 282.

In some embodiments, a sealing ring 294 is disposed below the lower surface of the upper support plate 276. The sealing ring 294 is also positioned above a sealing ring shoulder 296 within the interior, and proximate to the top, of the cylindrical or outer casing 268. The insertion and tightening of the ringed connector 282 relative to the cylindrical or outer casing 268 squeezes and expands the sealing ring 294 between the lower surface of the upper support plate 276 and the sealing ring shoulder 296.

In some alternative embodiments, the ringed connector threads 288 are positioned interior of and rotatably engage the outer casing attachment threads 298 at the top of the cylindrical or outer casing 268. The ringed connector 282 is rotated relative to the cylindrical or outer casing 268 by placement of a tool having aligned dual prongs, into engagement with the ringed connector 282, where one of the prongs of the tool is disposed into each of the ringed attachment grooves 292. The ringed connector 282 is then revolved/rotated relative to the cylindrical or outer casing 268 where the ringed connector 282 descends toward the sealing ring shoulder 296. The tightening of the ringed connector 282 relative to the outer casing attachment threads 298 establishes contact between the bottom pressing surface 290 and the upper surface of the upper support plate 276. Additional tightening of the ringed connector 282 relative to the cylindrical or outer casing 268 forces the upper support plate 276 downwardly pressing the lower surface of the upper support plate 276 against the sealing ring 294 which in turn is squeezed and expanded in a perpendicular direction through engagement with the sealing ring shoulder 296. A seal is thereby established between the encoder/Hall Effect Sensor 262 and the cylindrical or outer casing 268.

In at least one alternative embodiment, the exterior of the cylindrical or outer casing 268 includes the upper section 270. The upper section 270 is formed of an upper cylinder portion 300 and tightening surfaces 142 disposed below the upper cylinder portion 300. A casing manifold shoulder 140 is preferably disposed below the tightening surfaces 142. A second seal 138 is preferably positioned in the casing manifold shoulder 140 around the exterior of the cylindrical or outer casing 268.

In at lease one preferred embodiment, attachment threads 134 are positioned on the exterior surface of the cylindrical or outer casing 268 below the casing manifold shoulder 140. The attachment threads 134 preferably engage a threaded surface of the interior of a fluid conduit 108 or a threaded cavity 54 of a hydraulic circuit manifold 56. The rotation of the tightening surfaces 142 and the tightening engagement between the attachment threads 134 and the threads within the fluid conduit 108 or threaded cavity 54 establish a fluid seal between the second seal 138 and the threaded cavity 54 of the hydraulic circuit manifold 56.

In an alternative embodiment, the lower section 266 is disposed below the attachment threads 134. The lower section 266 includes the outlet fluid conduits 22. A lower collar portion 302 is disposed below the outlet fluid conduits 22. The lower collar portion 302 includes the first seal channel 128 and the first seal 130. The first seal 130 is above the base 68. The first seal 130 functions to establish another sealing surface between the exterior of the cylindrical or outer casing 268 and the interior surface of a fluid conduit 108 or a threaded cavity 54 of a hydraulic circuit manifold 56, restricting fluid passage to the interior of the cartridge style hydraulic flow sensor 250 as indicated by arrow 26.

Referring to FIG. 21. A side elevation view of one alternative embodiment of the cartridge style hydraulic flow sensor 250 is shown. In FIG. 21 the wire harness connector 280 is shown coupled to a communication connector 304.

As described herein a reference to a top may be synonymous and interchangeable with a reference to an exterior relative to a fluid conduit 108, cavity 54, or hydraulic circuit manifold 56 at a location proximate to outer casing connector support shoulder 286. Also as described herein a reference to upward is to be considered as a reference toward an outer casing connector support shoulder 286 from the base 68.

As described herein a reference to a bottom may be synonymous and interchangeable with a reference to an area proximate to the base 68 which in an assembled configuration will be disposed interior to a fluid conduit 108, cavity 54, or hydraulic circuit manifold 56. Also as described herein a reference to downward is to be considered as a reference toward a base 68 from an area proximate to outer casing connector support shoulder 286 or upper support plate 276 towards the fluid conduit 108, cavity 54, or hydraulic circuit manifold 56.

In some alternative embodiments, the cartridge style hydraulic flow sensor 250 may be attached to a fluid conduit 108 or hydraulic circuit manifold 56 at any desired angle.

In at least one alternative embodiment, the upper section 270 includes a substantially cylindrically shaped upper cartridge interior wall 306. The upper cartridge interior wall 306 is preferably sized to receive the sensor housing 252 during assembly of the cartridge style hydraulic flow sensor 250. During assembly the partially conical lower portion 198 of the sensor housing 252 is disposed downwardly within the upper cartridge interior wall 306 for positioning of the partially conical lower portion 198 proximate to the impeller 42.

In at least one embodiment, the lower portion 264 of the lower section 266 includes a sensor shoulder 150 which is located above and proximate to the outlet fluid conduits 22, and below the attachment threads 134. A lower sensor ledge 176 of the sensor housing 252 engages the sensor shoulder 150 when the sensor housing 252 is in the engaged assembled position relative to the cylindrical or outer casing 268.

In some embodiments, the engagement between the lower sensor ledge 176 and the sensor shoulder 150 functions as a positioning restrictor of stop to prevent undesirable downward placement of the tip or lower surface 152 into contact with the top surface of the impeller 42. The placement of the sensor shoulder 150 may be adjusted upwardly or downwardly along the lower portion 264 dependent upon a particular application and size selected for the sensor housing 252, the outlet fluid conduits 22, the impeller 42, and the shaft or spindle assembly 148. Preferably the location of the sensor shoulder 150 on the lower portion 264 of the lower section 266 optimizes the detection of the revolutions of the slugs 188 of the impeller 42 by the encoder/Hall Effect Sensor 262.

In at least one alternative embodiment, following insertion of the sensor housing 252 within the upper cartridge interior wall 306, an upper cartridge positioning ring 308 will be releasably placed within an upper cartridge ring channel 310. The upper cartridge ring channel 310 is preferably disposed into the upper cartridge interior wall 306 at a location below the casing manifold shoulder 140 and above the housing top 260 when the sensor housing 252 is placed into a fully assembled position. In this embodiment, the upper cartridge positioning ring 308 and the upper cartridge ring channel 310 function as an upper position restriction or stop member for the sensor housing 252. During periods of high fluid pressure within the cartridge style hydraulic flow sensor 250 the upper cartridge positioning ring 308 and the upper cartridge ring channel 310 prevent upward movement of the sensor housing 252 and the separation of the tip or lower surface 152 and the encoder/Hall Effect Sensor 262 from a desired location relative to the slugs 188 of the impeller 42.

In at least one alternative embodiment, the upper cartridge interior wall 306 includes a flat vertical interior surface extending from a location proximate to the attachment threads 134 upwardly to the sealing ring shoulder 296. The flat vertical interior surface is preferably used as a vertical positioning assist chute and receives the seat 208 during insertion of the sensor housing 252 within the upper cartridge interior wall 306. The flat vertical interior surface facilitates the placement of the sensor housing 252 in a desired orientation relative to the cylindrical or outer casing 268 during assembly.

It should be noted that the diameter dimension for the lower portion 264 of the lower section 266 is less than the diameter dimension for the upper cartridge interior wall 306 of the upper section 270.

In some alternative embodiments, the lower portion 264 of the lower section 266 proximate to the base 68 includes a first positioning ring groove 144 as earlier described. During assembly of the cartridge style hydraulic flow sensor 250 the first positioning ring 146 is initially placed into releasable engagement with the first positioning ring groove 144 from either the top or the bottom of the cylindrical or outer casing 268. The shaft or spindle assembly 148 is then inserted into the upper cartridge interior wall 306 from the top where the bottom of the shaft or spindle assembly 148 rests upon the first positioning ring 146. The shaft or spindle assembly 148 is positioned within the cylindrical or outer casing 268 with the shaft or spindle 186 disposed upwardly toward the upper section 270 or away from the base 68.

During assembly of the cartridge style hydraulic flow sensor 250, the impeller 42 is placed into rotatable and releasable engagement with the shaft or spindle assembly 148. The surface of the impeller 42 opposite to the slugs 188 having the shaft or spindle receiver 192 is disposed toward the shaft or spindle assembly 148. The impeller 42 and the shaft or spindle assembly 148 are then aligned for insertion of the central column 182 into the shaft or spindle receiver 192 and the movement of the impeller 42 downwardly towards the shaft or spindle assembly 148.

The sensor housing 252 is then inserted into the interior of the cylindrical or outer casing 268 positioning the partially conical lower portion 198 downwardly toward the impeller 42 and the slugs 188. In this configuration the exterior housing wall 258 is proximate to the upper cartridge interior wall 306. The sensor housing 252 is moved downwardly towards the impeller 42 until contact is established between the lower sensor ledge 176 and the sensor shoulder 150 positioning the tip or lower surface 152 proximate to the slugs 188.

A sealing ring 294 is then placed within the top of the cylindrical or outer casing 268 and positioned for contact with the sealing ring shoulder 296.

The encoder/Hall Effect Sensor 262 is then inserted into the interior of the cylindrical or outer casing 268 and the sealing ring 294 is disposed to the exterior of the outer case 272. Continued insertion of the encoder/Hall Effect Sensor 262 positions the lower cap 274 within the housing bore 254 where the outer case 272 is adjacent to the interior housing wall 256. The encoder/Hall Effect Sensor 262 is inserted downwardly within the housing bore 254 for contact between the lower cap 274 and the junction between the interior housing wall 256 and the interior of the partially conical lower portion 198. The positioning of the encoder/Hall Effect Sensor 262 within the cylindrical or outer casing 268 and into the sensor housing 252 places the lower surface of the upper support plate 276 above and into contact with the sealing ring 294.

A upper cartridge positioning ring 308 may be installed within the interior of the cylindrical or outer casing 268 and moved downwardly for expanded/outward insertion into the upper cartridge ring channel 310 located above the sensor housing 252. The upper cartridge positioning ring 308 also preferably is positioned in a surrounding circumferential position relative to the outer case 272.

It should be noted that a space is established above the housing top 260 and between the outer case 272 and the upper cartridge interior wall 306. In at least one embodiment, the encoder/Hall Effect Sensor 262 is not in contact with the upper cartridge interior wall 306 and is centrally disposed with respect to the upper cartridge interior wall 306 and the cylindrical or outer casing 268. The elongate encoder/Hall Effect Sensor 262 then positions the wire harness 278 proximate and exterior to the top of the cylindrical or outer casing 268.

The ringed connector 282 may be disposed within the top of the cylindrical or outer casing 268. A tool having dual prongs may then engage the ringed attachment grooves 292 where rotation of the ringed connector 282 engages the ringed connector threads 288 to the outer casing attachment threads 298. Continued rotation of the ringed connector 282 downwardly causes the bottom pressing surface 290 of the ringed connector 282 to contact the upper surface of the upper support plate 276 creating a downward pressure on the upper support plate 276 and the sealing ring 294. Rotation of the ringed connector 282 relative to the cylindrical or outer casing 268 continues until the lower surface of the attachment positioning ledge 284 is proximate to or in contact with the outer casing connector support shoulder 286.

The cartridge style hydraulic flow sensor 250 may then be releasably coupled to a hydraulic circuit manifold 56 or a fluid conduit 108 where the attachment threads 134 engage threads of the interior of a fluid conduit 108. Rotation of the cartridge style hydraulic flow sensor 250 may occur by the use of a tool as engaged to the tightening surfaces 142 until a desired seal is established between the second seal 138 and a fluid conduit 108, a cavity 54, and/or a hydraulic circuit manifold 56.

The wire harness connector 280 may then be coupled to a suitable electric connector as in communication with a hydraulic system control for monitoring and/or regulation of the rate of fluid flow within a fluid or a hydraulic system.

In a first embodiment, a cartridge hydraulic flow sensor includes a cylindrical casing having an exterior, an interior, a head, and a base, the casing having a first port and a second port through the casing, the first port and the second port permitting a fluid to flow into the interior and out of the interior, the first port being proximate to the base and the second port being between the head and the first port; a sensor is disposed in the interior, the sensor being proximate to the second port, the sensor detecting a number of revolutions of a rotatable impeller rotating about a shaft during a period of time; the shaft having a first end, the shaft being disposed centrally within the interior and extending away from the sensor; the rotatable impeller being engaged to the first end, the impeller revolving about the shaft following contact with the flow of the fluid; and an electric coupler having a transmitter is in communication with the sensor, the electric coupler being engaged to the head, wherein the sensor communicates to the transmitter the detected number of revolutions of the impeller about the shaft during the period of time, the transmitter being in communication with a controller, the transmitter communicating to the controller the detected number of revolutions of the impeller about the shaft.

In a second alternative embodiment according to the first embodiment, the sensor includes at least one magnet.

In a third alternative embodiment according to the second embodiment, the cartridge flow sensor is releasably secured within a cavity of a hydraulic circuit manifold.

In a fourth alternative embodiment according to the third embodiment, the flow of the fluid enters into the interior through the first port.

In a fifth alternative embodiment according to the third embodiment, the flow of the fluid enters into the interior through the second port.

In a sixth alternative embodiment according to the third embodiment, the exterior includes threads, wherein the threads secure the cartridge casing within the cavity of the hydraulic circuit manifold.

In a seventh alternative embodiment according to the third embodiment, the sensor includes a circuit board.

In an eighth alternative embodiment according to the seventh embodiment, the electric coupler is engaged to a platform, the head having a ledge, the platform being supported by the ledge.

In a ninth alternative embodiment according to the eighth embodiment, the electric coupler has leads, the leads providing communication between the transmitter and the controller.

In a tenth alternative embodiment according to the ninth embodiment, the sensor is a Hall Effect Sensor.

In an eleventh alternative embodiment according to the tenth embodiment, the invention includes a check valve, the check valve being disposed proximate to the base, the check valve restricting the flow of the fluid to a single direction within the interior.

In a twelfth alternative embodiment according to the eleventh embodiment, the invention includes a pressure sensor, the pressure sensor being disposed in the interior, the pressure sensor being in communication with the transmitter, the pressure sensor detecting fluid pressure within a fluid conduit.

In a thirteenth alternative embodiment according to the twelfth embodiment, the invention includes a temperature sensor, the temperature sensor being disposed in the interior, the temperature sensor being in communication with the transmitter, the temperature sensor detecting a temperature of the fluid within the interior.

In a fourteenth alternative embodiment according to the thirteenth embodiment, the transmitter communicates to the controller at least two of the detected number of revolutions of the impeller about the shaft, the detected fluid pressure within a fluid conduit, and the detected temperature of the fluid within the interior.

In a fifteenth alternative embodiment according to the fourteenth embodiment, the controller determines a rate of fluid passage within the interior and the controller communicates at least one of the rate of fluid passage, the detected fluid pressure within a fluid conduit, and the detected temperature of the fluid within the interior to an operator.

In a sixteenth alternative embodiment according to the fifteenth embodiment, the controller automatically communicates a command signal to at least one component of a hydraulic system for modification of at least one of the rate of fluid passage, the detected fluid pressure within a fluid conduit, and the detected temperature of the fluid within the interior.

In a seventeenth alternative embodiment a cartridge hydraulic flow sensor includes a cylindrical casing having an exterior, an interior, a head, and a base, the casing having a first port and a second port through the casing, the first port and the second port permitting a fluid to flow into the interior and out of the interior, the first port being proximate to the base and the second port being between the head and the first port; a sensor engaged to the head, the sensor detecting a number of revolutions of a rotatable impeller rotating a shaft during a period of time; the shaft having a first end and a second end, the shaft being disposed centrally within the interior; the rotatable impeller being engaged to the first end, the impeller revolving the shaft following contact with the flow of the fluid; a gear engaged to the second end, the gear having a magnetic material, the sensor being proximate to the gear, the shaft rotating the gear relative to the sensor; and an electric coupler having a transmitter in communication with the sensor, the electric coupler being engaged to the head, wherein the sensor communicates to the transmitter the detected number of revolutions of the gear during the period of time, the transmitter being in communication with a controller, the transmitter communicating to the controller the detected number of revolutions of the gear during the period of time.

In an eighteenth alternative embodiment, a cartridge style hydraulic flow sensor includes a cylindrical casing comprising an exterior, an interior, an outlet section, and a base, the casing having a first port and a second port through the casing, the first port and the second port permitting a fluid to flow into the interior and out of the interior, the first port being proximate to the base and the second port being in the outlet section, a Hall Effect Sensor is disposed in the interior, the Hall Effect Sensor being proximate to the second port, the Hall Effect Sensor detecting a number of revolutions of a rotatable impeller rotating about a shaft during a period of time, the rotatable impeller being engaged to a shaft support having the shaft, the impeller revolving about the shaft following contact with the flow of the fluid, and a cover having a communication connector, the communication connector being in communication with a circuit board, the circuit board being in communication with the Hall Effect Sensor, wherein the Hall Effect Sensor communicates to the circuit board the detected number of revolutions of said impeller about the shaft during the period of time, the circuit board being constructed and arranged to compare the detected number of revolutions of the impeller about the shaft during the period of time to data stored on the circuit board, the circuit board communicating to the communication connector at least one of the detected number of revolutions of the impeller about the shaft during the period of time, the detected number of revolutions of the impeller about the shaft during the period of time exceeding the data, and the detected number of revolutions of the impeller about the shaft during the period of time being less than the data, and further wherein the cylindrical casing is constructed and arranged for insertion into a cavity of a manifold, the cavity being in fluid flow communication with a manifold conduit, the head being proximate to a manifold exterior and the base being disposed in a manifold interior, the first port and the second port being in fluid flow communication with the manifold conduit.

In a nineteenth alternative embodiment according to the eighteenth embodiment, the circuit board further includes a receiving connector, a plurality of connection wires, and an interface connector connected to the connection wires.

In a twentieth alternative embodiment according to the nineteenth embodiment, the circuit board further includes a selector switch, a microprocessor and memory.

In a twenty-first alternative embodiment according to the twentieth embodiment, the data is stored on the memory and the microprocessor compares the detected number of revolutions of the impeller about the shaft during the period of time to the data.

In a twenty-second alternative embodiment according to the twenty-first embodiment, the data comprises a plurality of individual fluid flow information parameters, and further wherein the selector switch directs the microprocessor to at least one of the plurality of individual fluid flow information parameters.

In a twenty-third alternative embodiment according to the twenty-second embodiment, the interior further includes at least one of a sensor shoulder and a circuit board shoulder.

In a twenty-fourth alternative embodiment according to the twenty-third embodiment, the exterior further includes at least one of a first seal channel and a second seal channel.

In a twenty-fifth alternative embodiment according to the twenty-fourth embodiment, the at least one casing exterior seal is disposed in at least one of the first seal channel and the second seal channel.

In a twenty-sixth alternative embodiment according to the twenty-fifth embodiment, the Hall Effect Sensor additionally includes a Hall Effect Sensor exterior, the Hall Effect Sensor exterior having at least one of a third seal channel and a fourth seal channel.

In a twenty-seventh alternative embodiment according to the twenty-sixth embodiment, the at least one Hall Effect Sensor exterior seal is disposed in at least one of the third seal channel and the fourth seal channel.

In a twenty-eighth alternative embodiment according to the twenty-seventh embodiment, the interior has the circuit board shoulder, the circuit board engaging the circuit board shoulder.

In a twenty-ninth alternative embodiment according to the twenty-eighth embodiment, the circuit board has at least one slot passage.

In a thirtieth alternative embodiment according to the twenty-ninth embodiment, the shaft support has a base collar, at least two spindle supports, and a central column.

In a thirty-first alternative embodiment according to the thirtieth embodiment, the interior has the sensor shoulder, the Hall Effect Sensor exterior having a lower sensor ledge, the lower sensor ledge engaging the sensor shoulder.

In a thirty-second alternative embodiment according to the thirty-first embodiment, the Hall Effect Sensor exterior has a head nub.

In a thirty-third alternative embodiment according to the thirty-second embodiment, the cartridge hydraulic flow sensor includes a pressure sensor, the pressure sensor being disposed in the interior, the pressure sensor detecting fluid pressure within the manifold conduit.

In a thirty-fourth alternative embodiment according to the thirty-third embodiment, the cartridge hydraulic flow sensor includes a temperature sensor disposed in the interior, the temperature sensor detecting a temperature of the fluid within the interior.

In a thirty-fifth alternative embodiment according to the thirty-fourth embodiment, the circuit board communicates at least two of the detected number of revolutions of the impeller about the shaft, the detected fluid pressure within the manifold conduit, and the detected temperature of the fluid within the interior.

In a thirty-sixth alternative embodiment according to the thirty-fifth embodiment, the circuit board automatically communicates a command signal to at least one component of a hydraulic system for modification of at least one of a rate of fluid passage, the detected fluid pressure within the manifold conduit, and the detected temperature of the fluid within the interior.

In a thirty-seventh alternative embodiment according to one or more of the previous embodiments in any combination, a cartridge style hydraulic flow sensor includes a cylindrical casing comprising an exterior, an interior, and a base, the casing having a first port and a second port through the casing, the first port and the second port permitting a fluid to flow into the interior and out of the interior, the first port being proximate to the base; a sensor housing disposed in the interior, the sensor housing being proximate to the second port, the sensor housing having a housing bore; an elongate encoder/sensor having a lower cap and a sensor interior, the lower cap being disposed in the housing bore, the encoder/sensor detecting a number of revolutions of a rotatable impeller rotating about a shaft during a period of time; the encoder/sensor having an upper support plate and a wire harness through the upper support plate, the wire harness being engaged to and in communication with a circuit board, the circuit board being in the sensor interior, the wire harness having a communication connector exterior of the upper support plate; the rotatable impeller being engaged to a shaft support having the shaft, the rotatable impeller revolving about the shaft following contact with the flow of the fluid; and wherein the encoder/sensor communicates to the circuit board the detected number of revolutions of the impeller about the shaft during the period of time, the circuit board being constructed and arranged to compare the detected number of revolutions of the impeller about the shaft during the period of time to data stored on the circuit board, the circuit board communicating to the communication connector at least one of the detected number of revolutions of the impeller about the shaft during the period of time, the detected number of revolutions of the impeller about the shaft during the period of time exceeding the data, and the detected number of revolutions of the impeller about the shaft during the period of time being less than the data, and further wherein the cylindrical casing is constructed and arranged for insertion into a cavity of a manifold, the cavity being in fluid flow communication with a manifold conduit, the base being disposed in a manifold interior, the first port and the second port being in fluid flow communication with the manifold conduit.

In a thirty-eighth alternative embodiment according to the thirty-seventh embodiment, the casing has an upper section and a lower section, the second port being in the lower section.

In a thirty-ninth alternative embodiment according to the thirty-eighth embodiment, the circuit board further comprises a microprocessor and memory.

In a fortieth alternative embodiment according to the thirty-ninth embodiment, the data is stored on the memory and the microprocessor compares the detected number of revolutions of the impeller about the shaft during the period of time to the data.

In a forty-first alternative embodiment according to the fortieth embodiment, the interior further comprises at least one of a sensor shoulder, and an upper cartridge ring channel.

In a forty-second alternative embodiment according to the forty-first embodiment, the casing further comprises a sealing ring shoulder and a sealing ring disposed in the sealing ring shoulder.

In a forty-third alternative embodiment according to the forty-second embodiment, the cartridge style hydraulic flow sensor has a ringed connector rotatably engaged to the interior above the upper support plate.

In a forty-fourth alternative embodiment according to the forty-third embodiment, the exterior has at least one of a first seal channel and a second seal channel.

In a forty-fifth alternative embodiment according to the forty-fourth embodiment, the at least one casing exterior seal is disposed in at least one of the first seal channel and the second seal channel.

In a forty-sixth alternative embodiment according to the forty-fifth embodiment, the sensor housing has at least one of a third seal channel and a fourth seal channel.

In a forty-seventh alternative embodiment according to the forty-sixth embodiment, the at least one housing exterior seal is disposed in at least one of the third seal channel and the fourth seal channel.

In a forty-eighth alternative embodiment according to the forty-seventh embodiment, the shaft support has a base collar, at least two spindle supports, and a central column.

In a forty-ninth alternative embodiment according to the forty-eighth embodiment, the interior has the sensor shoulder, the sensor housing having a lower sensor ledge, the lower sensor ledge engaging the sensor shoulder.

In a fiftieth alternative embodiment according to the forty-ninth embodiment, the cartridge style hydraulic flow sensor further comprises a pressure sensor, the pressure sensor being disposed in the interior, the pressure sensor detecting fluid pressure within the manifold conduit.

In a fifty-first alternative embodiment according to the fiftieth embodiment, the cartridge style hydraulic flow sensor further comprises a temperature sensor disposed in the interior, the temperature sensor detecting a temperature of the fluid within the interior.

In a fifty-second alternative embodiment according to the fifty-first embodiment, the circuit board communicates at least two of the detected number of revolutions of the impeller about the shaft, the detected fluid pressure within the manifold conduit, and the detected temperature of the fluid within the interior.

In a fifty-third alternative embodiment according to the fifty-second embodiment, the circuit board automatically communicates a command signal to at least one component of a hydraulic system for modification of at least one of a rate of fluid passage, the detected fluid pressure within the manifold conduit, and the detected temperature of the fluid within the interior.

This completes the description of the preferred and alternate embodiments of the invention. Those skilled in the art may recognize other equivalents to the specific embodiment described herein which equivalents are intended to be encompassed by the claims attached hereto.

The above disclosure is intended to be illustrative and not exhaustive. This description will suggest many variations and alternatives to one of ordinary skill in this art. The various elements shown in the individual figures and described above may be combined or modified for combination as desired. All these alternatives and variations are intended to be included within the scope of the claims where the term "comprising" means "including, but not limited to".

These and other embodiments which characterize the invention are pointed out with particularity in the claims annexed hereto and forming a part hereof. However, for further understanding of the invention, its advantages and objectives obtained by its use, reference should be made to the drawings which form a further part hereof and the accompanying descriptive matter, in which there is illustrated and described embodiments of the invention.

With respect to the above description, it is to be realized that the optimum dimensional relationships for the parts of the invention, to include variations in size, materials, shape, form, function and manner of operation, assembly and use, are deemed to be within the expertise of those skilled in the art, and all equivalent structural variations and Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

The invention claimed is:

1. A cartridge hydraulic flow sensor comprising:
a cylindrical casing comprising an exterior, an interior, and a base, said casing having a first port and a second port through said casing, said first port and said second port permitting a fluid to flow into said interior and out of said interior, said first port being proximate to said base;
a sensor housing disposed in said interior, said sensor housing being proximate to said second port, said sensor housing having a housing bore;
an elongate encoder/sensor having a lower cap and a sensor interior, said lower cap being disposed in said housing bore, said encoder/sensor detecting a number of revolutions of a rotatable impeller rotating about a shaft during a period of time;

said encoder/sensor having an upper support plate and a wire harness through said upper support plate, said wire harness being engaged to and in communication with a circuit board, said circuit board being in said sensor interior, said wire harness having a communication connector exterior of said upper support plate;
said rotatable impeller being engaged to a shaft support having said shaft, said rotatable impeller revolving about said shaft following contact with said flow of said fluid; and
wherein said encoder/sensor communicates to said circuit board said detected number of revolutions of said impeller about said shaft during said period of time, said circuit board being constructed and arranged to compare said detected number of revolutions of said impeller about said shaft during said period of time to data stored on said circuit board, said circuit board communicating to said communication connector at least one of said detected number of revolutions of said impeller about said shaft during said period of time, said detected number of revolutions of said impeller about said shaft during said period of time exceeding said data, and said detected number of revolutions of said impeller about said shaft during said period of time being less than said data,
and further wherein said cylindrical casing is constructed and arranged for insertion into a cavity of a manifold, said cavity being in fluid flow communication with a manifold conduit, said base being disposed in a manifold interior, said first port and said second port being in fluid flow communication with said manifold conduit.

2. The cartridge hydraulic flow sensor according to claim 1, said casing having an upper section and a lower section, said second port being in said lower section.

3. The cartridge hydraulic flow sensor according to claim 2, said circuit board further comprising a microprocessor and memory.

4. The cartridge hydraulic flow sensor according to claim 3, wherein said data is stored on said memory and said microprocessor compares said detected number of revolutions of said impeller about said shaft during said period of time to said data.

5. The cartridge hydraulic flow sensor according to claim 4, said interior further comprising at least one of a sensor shoulder, and an upper cartridge ring channel.

6. The cartridge hydraulic flow sensor according to claim 5, said casing further comprising a sealing ring shoulder and a sealing ring disposed in said sealing ring shoulder.

7. The cartridge hydraulic flow sensor according to claim 6, having a ringed connector rotatably engaged to said interior above said upper support plate.

8. The cartridge hydraulic flow sensor according to claim 7, said exterior having at least one of a first seal channel and a second seal channel.

9. The cartridge hydraulic flow sensor according to claim 8, wherein at least one casing exterior seal is disposed in at least one of said first seal channel and said second seal channel.

10. The cartridge hydraulic flow sensor according to claim 8, said sensor housing having at least one of a third seal channel and a fourth seal channel.

11. The cartridge hydraulic flow sensor according to claim 10, wherein at least one housing exterior seal is disposed in at least one of said third seal channel and said fourth seal channel.

12. The cartridge hydraulic flow sensor according to claim 11, said shaft support having a base collar, at least two spindle supports, and a central column.

13. The cartridge hydraulic flow sensor according to claim 12, said interior having said sensor shoulder, said sensor housing having a lower sensor ledge, said lower sensor ledge engaging said sensor shoulder.

14. The cartridge hydraulic flow sensor according to claim 13, further comprising a pressure sensor, said pressure sensor being disposed in said interior, said pressure sensor detecting fluid pressure within said manifold conduit.

15. The cartridge hydraulic flow sensor according to claim 14, further comprising a temperature sensor disposed in said interior, said temperature sensor detecting a temperature of said fluid within said interior.

16. The cartridge hydraulic flow sensor according to claim 15, wherein said circuit board communicates at least two of said detected number of revolutions of said impeller about said shaft, said detected fluid pressure within said manifold conduit, and said detected temperature of said fluid within said interior.

17. The cartridge hydraulic flow sensor according to claim 16, wherein said circuit board automatically communicates a command signal to at least one component of a hydraulic system for modification of at least one of a rate of fluid passage, said detected fluid pressure within said manifold conduit, and said detected temperature of said fluid within said interior.

* * * * *